US012701724B2

(12) United States Patent
Elsherbini et al.

(10) Patent No.: US 12,701,724 B2
(45) Date of Patent: Aug. 4, 2026

(54) MICROELECTRONIC ASSEMBLIES WITH INDUCTORS IN DIRECT BONDING REGIONS

(71) Applicant: Intel Corporation, Santa Clara, CA (US)

(72) Inventors: Adel A. Elsherbini, Chandler, AZ (US); Krishna Bharath, Phoenix, AZ (US); Kevin P. O'Brien, Portland, OR (US); Kimin Jun, Portland, OR (US); Han Wui Then, Portland, OR (US); Mohammad Enamul Kabir, Portland, OR (US); Gerald S. Pasdast, San Jose, CA (US); Feras Eid, Chandler, AZ (US); Aleksandar Aleksov, Chandler, AZ (US); Johanna M. Swan, Scottsdale, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 18/761,443

(22) Filed: Jul. 2, 2024

(65) Prior Publication Data

US 2024/0355768 A1 Oct. 24, 2024

Related U.S. Application Data

(63) Continuation of application No. 17/025,181, filed on Sep. 18, 2020, now Pat. No. 12,062,631.

(51) Int. Cl.
*H10D 1/20* (2025.01)
*H10W 72/30* (2026.01)
(Continued)

(52) U.S. Cl.
CPC .............. *H10D 1/20* (2025.01); *H10W 90/00* (2026.01); *H10W 72/353* (2026.01);
(Continued)

(58) Field of Classification Search
CPC ...... H10D 1/20; H10W 90/00; H10W 72/353; H10W 72/923; H10W 72/926; H10W 72/936; H10W 72/952; H10W 72/957; H10W 80/721; H10W 80/732; H10W 80/754; H10W 90/732; H10W 90/792; H10W 80/00; H10W 70/63; H10W 72/01931; H10W 72/01935;
(Continued)

(56) References Cited

U.S. PATENT DOCUMENTS

| | | | | |
|---|---|---|---|---|
| 11,600,594 B2 * | 3/2023 | Liff | ........................ | H10W 90/00 |
| 2012/0187530 A1 * | 7/2012 | Zhang | .................. | H10D 88/101 |
| | | | | 257/532 |

(Continued)

*Primary Examiner* — Douglas W Owens
(74) *Attorney, Agent, or Firm* — Akona IP PC

(57) ABSTRACT

Disclosed herein are microelectronic assemblies including microelectronic components that are coupled together by direct bonding, as well as related structures and techniques. For example, in some embodiments, a microelectronic assembly may include a first microelectronic component and a second microelectronic component coupled to the first microelectronic component by a direct bonding region, wherein the direct bonding region includes at least part of an inductor.

20 Claims, 20 Drawing Sheets

(51) Int. Cl.

| | |
|---|---|
| *H10W 72/90* | (2026.01) |
| *H10W 80/00* | (2026.01) |
| *H10W 90/00* | (2026.01) |

(52) U.S. Cl.
CPC ........ *H10W 72/923* (2026.01); *H10W 72/926* (2026.01); *H10W 72/936* (2026.01); *H10W 72/952* (2026.01); *H10W 72/957* (2026.01); *H10W 80/721* (2026.01); *H10W 80/732* (2026.01); *H10W 80/754* (2026.01); *H10W 90/732* (2026.01); *H10W 90/792* (2026.01)

(58) Field of Classification Search
CPC ....... H10W 72/01953; H10W 72/0198; H10W 72/252; H10W 72/253; H10W 72/354; H10W 72/932; H10W 72/934; H10W 72/941; H10W 72/944; H10W 72/951; H10W 72/953; H10W 72/967; H10W 80/031; H10W 80/312; H10W 90/724; H10W 90/794; H10W 70/611; H10W 20/497; H10W 44/501; H10W 70/05; H10W 70/685; H10W 20/20; H10W 74/142; H10W 80/327; H10W 80/743; H10W 90/297; H10W 90/722; H10W 20/40; H10W 90/798; H01F 17/0033; H01F 27/303; H01F 2017/065
See application file for complete search history.

(56) References Cited

U.S. PATENT DOCUMENTS

| | | | |
|---|---|---|---|
| 2019/0221345 A1* | 7/2019 | Vadlamani | ............. C22C 45/04 |
| 2020/0075553 A1 | 3/2020 | Delacruz et al. | |
| 2020/0098621 A1* | 3/2020 | Bharath | ............. H10W 20/093 |
| 2022/0093547 A1* | 3/2022 | Elsherbini | ............... H10D 1/20 |

* cited by examiner

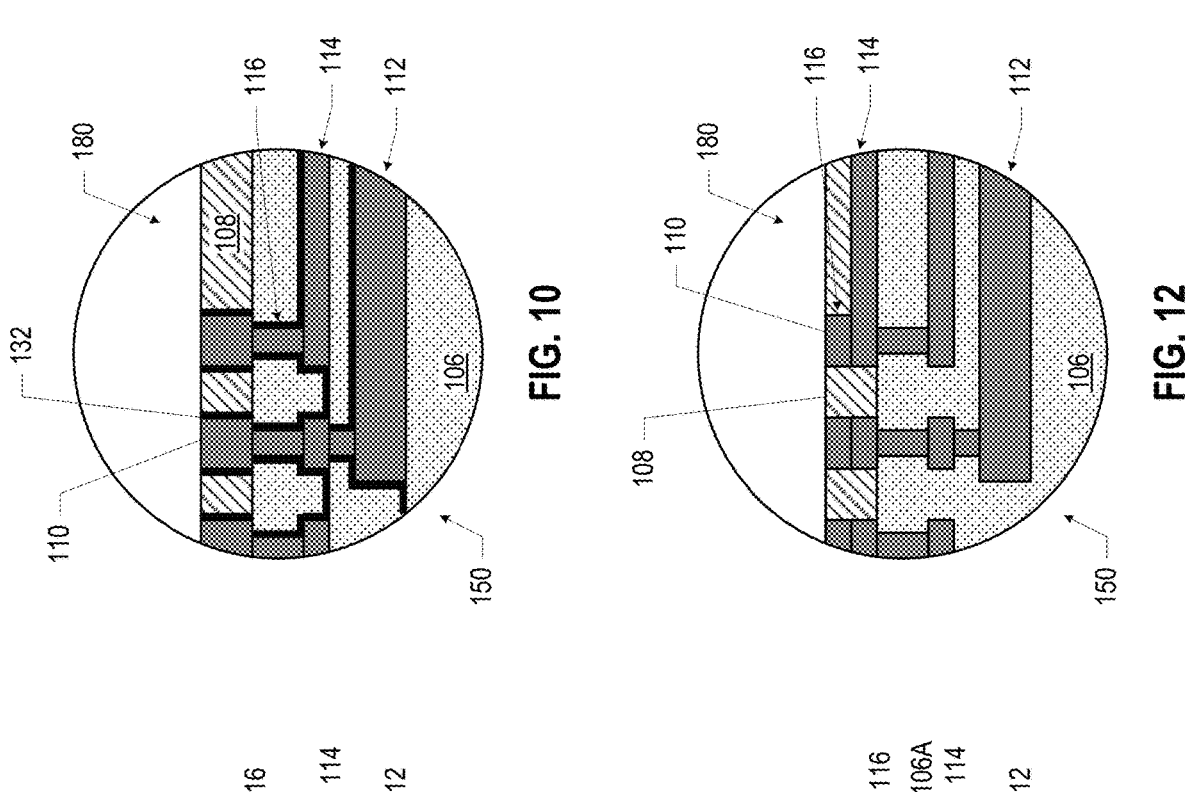
FIG. 10
FIG. 9
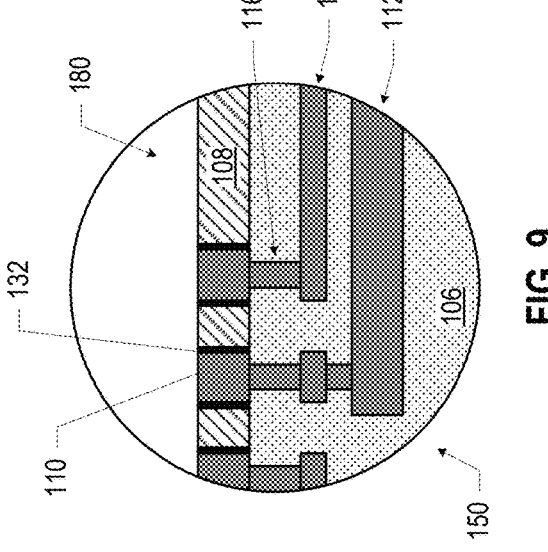
FIG. 12
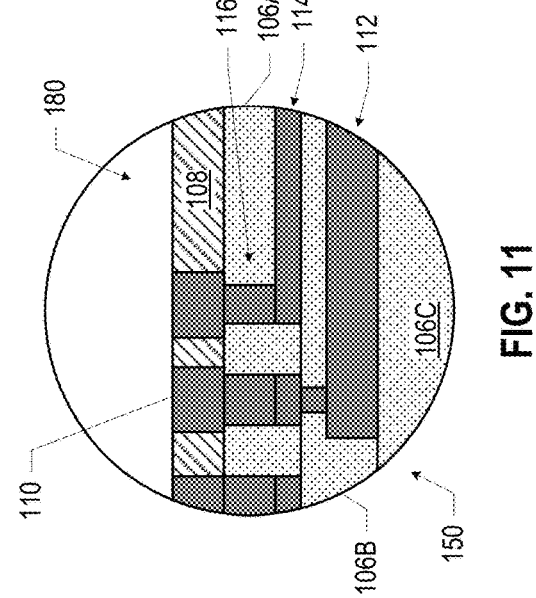
FIG. 11

MICROELECTRONIC ASSEMBLIES WITH INDUCTORS IN DIRECT BONDING REGIONS

CROSS-REFERENCE TO RELATED APPLICATIONS

This application is a continuation of (and claims the benefit of priority under 35 U.S.C. § 120 to) U.S. application Ser. No. 17/025,181, filed Sep. 18, 2020, now U.S. Pat. No. 12,062,631, and entitled "MICROELECTRONIC ASSEMBLIES WITH INDUCTORS IN DIRECT BONDING REGIONS," the disclosures of which are incorporated herein by reference as if set forth in full.

BACKGROUND

An integrated circuit (IC) package typically includes a die wirebonded or soldered to a package substrate. In use, electrical signals and power are passed between the package substrate and the die through the wirebonds or solder.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 9-12 are side, cross-sectional views of example direct bonding interfaces of a microelectronic component, in accordance with various embodiments.

DETAILED DESCRIPTION

Figure 1:
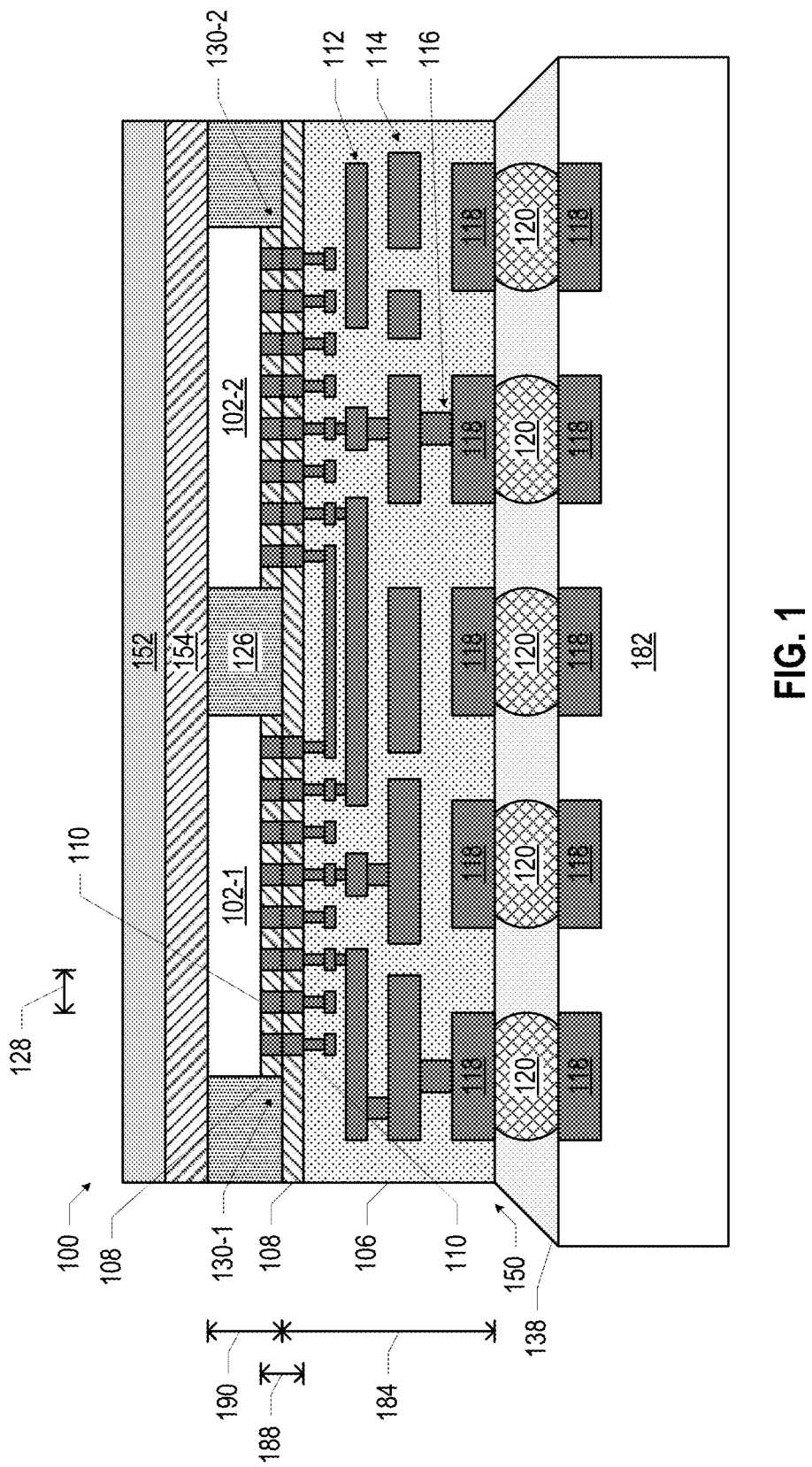
FIG. 1 is a side, cross-sectional view of an example microelectronic assembly including direct bonding, in accordance with various embodiments.

Disclosed herein are microelectronic assemblies including microelectronic components that are coupled together by direct bonding, as well as related structures and techniques. For example, in some embodiments, a microelectronic assembly may include a first microelectronic component and a second microelectronic component coupled to the first microelectronic component by a direct bonding region, wherein the direct bonding region includes at least part of an inductor.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features. For ease of discussion, the collection of drawings of FIGS. 18A and 18B may be referred to herein as "FIG. 18," the collection of drawings of FIGS. 42A and 42B may be referred to herein as "FIG. 42," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the heat transfer structure 152, the thermal interface material (TIM) 154, the mold material 126, the microelectronic component 102-2, the underfill material 138, and/or the support component 182 may not be included. Further, FIG. 1 illustrates a number of elements that are omitted from subsequent drawings for ease of illustration, but may be included in any of the microelectronic assemblies 100 disclosed herein. Examples of such elements include the heat transfer structure 152, the TIM 154, the mold material 126, the microelectronic component 102-2, the underfill material 138, and/or the support component 182. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
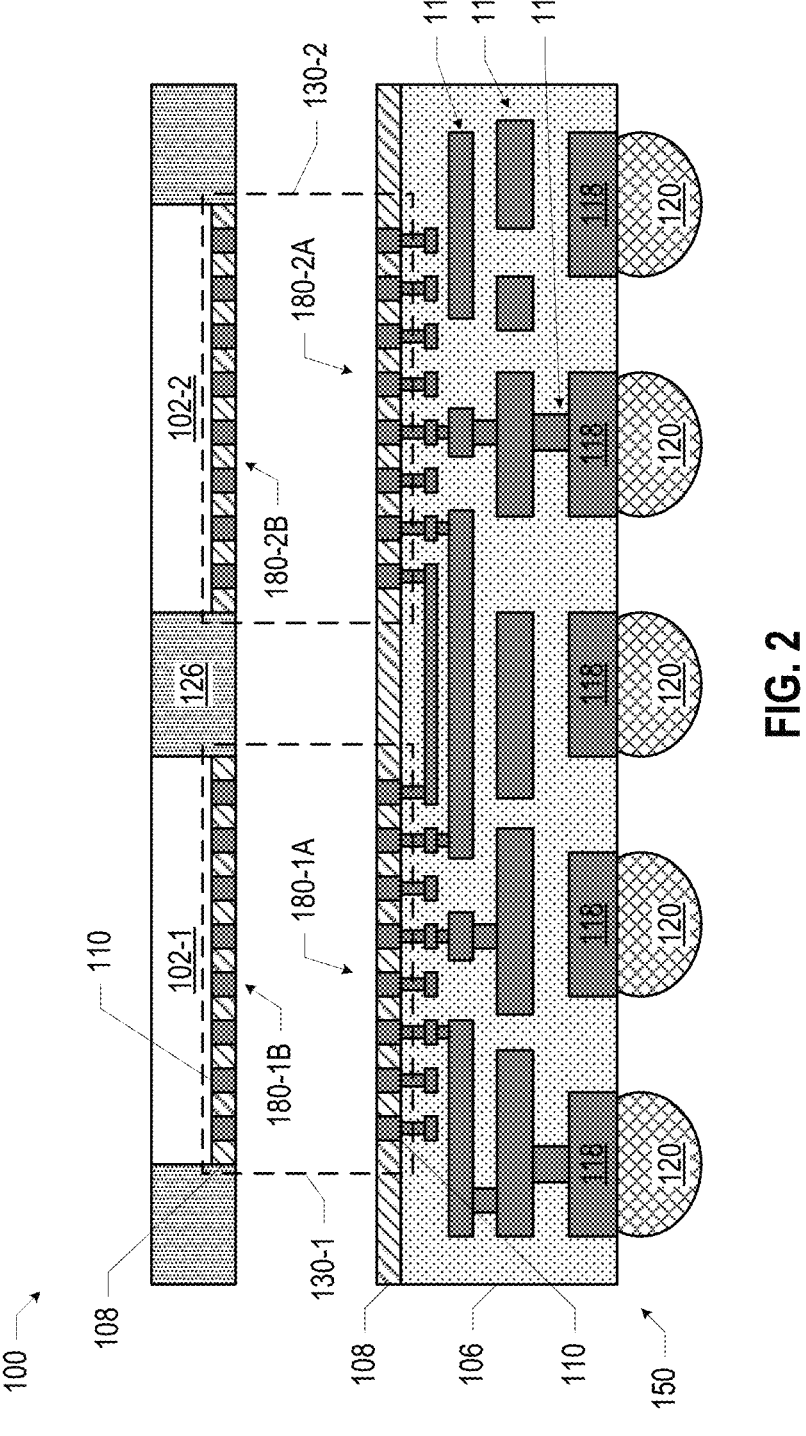
FIG. 2 is a side, cross-sectional exploded view of a portion of the microelectronic assembly of FIG. 1, in accordance with various embodiments.

The microelectronic assembly 100 may include an interposer 150 coupled to a microelectronic component 102-1 by a direct bonding (DB) region 130-1. In particular, as illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region 130 during processing. DB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof. Some particular embodiments of arrangements of DB dielectrics 108 including multiple dielectric materials are discussed below with reference to FIG. 4.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a comple-mentary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper alumi-num alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). Some particular arrangements of multiple materials in a DB contact 110 are discussed below with reference to FIG. 3). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 1 and 2 also illustrate a microelectronic component 102-2 coupled to the interposer 150 by a DB region 130-2 (via the DB interfaces 180-2A and 180-2B, as shown in FIG. 2). Although FIG. 1 depicts a particular number of micro-electronic components 102 coupled to the interposer 150 by DB regions 130, this number and arrangement are simply illustrative, and a microelectronic assembly 100 may include any desired number and arrangement of microelectronic components 102 coupled to an interposer 150 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accor-dance with any of the embodiments discussed below with reference to FIG. 3). Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures (e.g., in accordance with any of the embodiments discussed below with reference to FIG. 4).

The interposer 150 may include an insulating material 106 (e.g., one or more dielectric materials formed in multiple layers, as known in the art) and one or more conductive pathways 112 through the insulating material 106 (e.g., including conductive lines 114 and/or conductive vias 116, as shown). In some embodiments, the insulating material 106 of the interposer 150 may be an organic material, such as polyimide or polybenzoxazole, or may include an organic polymer matrix (e.g., epoxide) with a filler material (that may be inorganic). In some such embodiments, the inter-poser 150 may be referred to as an "organic interposer." In some embodiments, the insulating material 106 of an inter-poser 150 may be provided in multiple layers of organic buildup film. Organic interposers 150 may be less expensive to manufacture than semiconductor- or glass-based interpos-ers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that con-strain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Con-ventional integrated circuit packages including an organic interposer have been limited to solder-based attach tech-nologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as dis-closed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the inter-poser 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conduc-tive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example. Examples of some particular arrangements of liner materials 132 that may be part of conductive pathways 112 are discussed below with reference to FIGS. 9-10.

In some embodiments, a microelectronic component 102 may include an integrated circuit (IC) die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 50. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130 (and further through intervening microelectronic components 102). In some embodiments, a microelectronic component 102 may take the form of any of the embodiments of the interposer 150 herein. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component. Some particular examples of double-sided microelectronic components 102 are discussed below with reference to FIG. 18.

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 0.1 microns and 5 microns. In some embodiments, a thickness 190 of a microelectronic component 102 may be between 10 microns and 780 microns. In some embodiments, a pitch 128 of the DB contacts 110 in a DB region 130 may be less than 20 microns (e.g., between 0.1 microns and 20 microns).

Figures 3, 4, 5, 6, 7, 8:
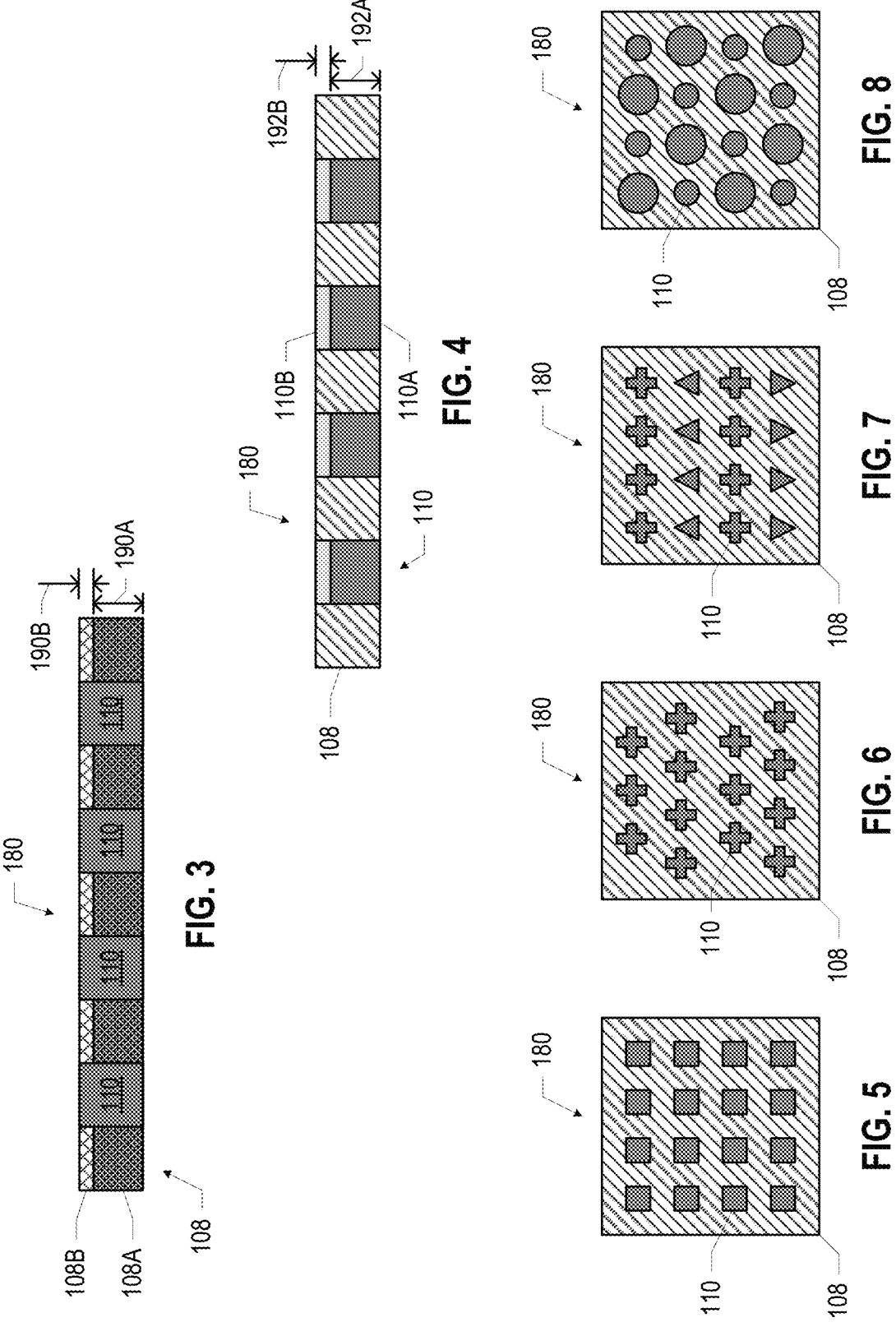
FIGS. 3 and 4 are side, cross-sectional views of example direct bonding interfaces of a microelectronic component, in accordance with various embodiments.
FIGS. 5-8 are top views of example direct bonding interfaces of a microelectronic component, in accordance with various embodiments.

FIGS. 3-41 illustrate additional example microelectronic assemblies 100 and components thereof. Any of the features discussed with reference to any of FIGS. 3-41 herein may be combined with any other features to form a microelectronic assembly 100 or component thereof. For example, as discussed further below, FIG. 4 illustrates an embodiment of a DB interface 180 in which a DB contact 110 includes multiple different material portions, and FIG. 9 illustrates an embodiment of a DB interface 180 in which a liner material 132 is present between a DB contact 110 and the adjacent DB dielectric 108. These features of FIGS. 4 and 9 may be combined so that a DB interface 180, in accordance with the present disclosure, has DB contacts 110 with multiple different material portions and a liner material 132 between DB contacts 110 and adjacent DB dielectric 108. This particular combination is simply an example, and any combination may be used.

As noted above, a DB dielectric 108 may include one or more materials arranged in any desired manner. For example, FIG. 3 illustrates a DB interface 180 (which may be part of an interposer 150 or a microelectronic component 102) that includes DB dielectric 108 around DB contacts 110. In the particular embodiment of FIG. 3, the DB dielectric 108 may include a first portion 108A and a second portion 108B, with the second portion 108B between the first portion 108A and the bonding surface of the DB interface 180. The first portion 108A and the second portion 108B may have different material compositions. For example, in some embodiments, the first portion 108A may include silicon and oxygen (e.g., in the form of silicon oxide), and the second portion 108B may include silicon, oxygen, carbon, and nitrogen (e.g., in the form of silicon oxycarbonitride). The thickness 190A of the first portion 108A may be greater than the thickness 190B of the second portion 108B. For example, in some embodiments, the thickness 190B may be less than 5 nanometers (e.g., less than 3 nanometers), while the thickness 190A may be greater than 5 nanometers (e.g., between 50 nanometers and 5 microns). When the thickness 190A is greater than the thickness 190B, the first portion 108A may be referred to as a "bulk" material and the second portion 108B may be referred to as an "interface" material of the DB dielectric 108. Although FIG. 3 illustrates an embodiment in which the DB dielectric 108 includes two portions, a DB dielectric 108 may include more than two portions (e.g., arranged in layers parallel to the bonding surface of the DB interface 180).

As also noted above, a DB contact 110 may include one or more materials arranged in any desired manner. For example, FIG. 4 illustrates a DB interface 180 (which may be part of an interposer 150 or a microelectronic component 102) that includes DB dielectric 108 around DB contacts 110. In the particular embodiment of FIG. 4, the DB contacts 110 may include a first portion 110A and a second portion 110B, with the second portion 110B between the first portion 110A and the bonding surface of the DB interface 180. The first portion 110A and the second portion 110B may have different material compositions. For example, in some embodiments, the first portion 110A may include copper, and the second portion 110B may include a noble metal (e.g., silver or gold); in such embodiments, the second portion 110B may serve to improve the resistance of the DB contacts 110 to corrosion. The thickness 192A of the first portion 110A may be greater than the thickness 192B of the second portion 110B. For example, in some embodiments, the thickness 192B may be less than 5 nanometers, while the thickness 192A may be greater than 50 nanometers. When the thickness 192A is greater than the thickness 192B, the first portion 110A may be referred to as a "bulk" material and the second portion 110B may be referred to as an "interface" material of the DB contacts 110. Although FIG. 4 illustrates an embodiment in which the DB contacts 110 include two portions, a DB contact 110 may include more than two portions (e.g., arranged in layers parallel to the bonding surface of the DB interface 180). In some embodiments, a DB interface 180 may include a DB dielectric 108 with multiple portions and a DB contact 110 with multiple portions.

The footprints of the DB contacts 110 in a DB interface 180 may have any desired shape, and multiple DB contacts 110 may be arranged within a DB interface 180 in any desired manner (e.g., by the use of lithographic patterning techniques to form the DB contacts 110). For example, FIGS. 5-8 are top views of various arrangements of DB contacts 110 in a DB dielectric 108 of a DB interface 180. In the embodiment of FIG. 5, the DB contacts 110 have rectangular (e.g., square) footprints and are arranged in a rectangular array. In the embodiment of FIG. 6, the DB contacts 110 have cross-shaped footprints and are arranged in a triangular array. In the embodiment of FIG. 7, the DB contacts 110 are arranged in a rectangular array, and alternating rows of the DB contacts 110 have cross-shaped footprints and triangular footprints. In the embodiment of FIG. 8, the DB contacts 110 are arranged in a rectangular array, the DB contacts 110 have circular footprints, and the diameters of the footprints of the DB contacts 110 vary in a checkerboard pattern. DB contacts 110 included in a DB interface 180 may have any suitable combination of these and other footprint shapes, sizes, and arrangements (e.g., hexagonal arrays, oval footprints, etc.). In some particular embodiments, DB contacts 110 in a DB interface 180 may have footprints shaped as convex polygons (e.g., squares, rectangles, octagons, cross shapes, etc.) or circles.

As noted above, in some embodiments, a liner material may be present between a DB contact 110 and the adjacent DB dielectric 108. For example, FIG. 9 illustrates a portion of an interposer 150 and its DB interface 180. In the embodiment of FIG. 9, a liner material 132 is present between the DB contacts 110 and the adjacent DB dielectric 108. The liner material 132 may serve as a diffusion barrier (e.g., to limit diffusion between the DB contacts 110 and the adjacent DB dielectric 108, such as the copper diffusion that may occur when the DB contacts 110 include copper and the DB dielectric 108 includes silicon oxide) and/or as an adhesion promoter (e.g., to improve the strength of the mechanical interface between the DB contacts 110 and the adjacent DB dielectric 108). In the particular embodiment of FIG. 9, the liner material 132 may not be present around the vias 116 and/or the lines 114 through the insulating material 106 of the interposer 150. In other embodiments, the liner material 132 may also be present around the vias 116 and/or the lines 114; such an embodiment is illustrated in FIG. 10. In some embodiments, a liner material 132 may only be present around the vias 116 and/or the lines 114, but not around the DB contacts 110 (not shown). In the embodiment of FIG. 9, the liner material 132 may be a conductive material (e.g., may include cobalt, ruthenium, or tantalum and nitrogen (e.g., in the form of tantalum nitride)), or a non-conductive material (e.g., silicon and nitrogen (e.g., in the form of silicon nitride), or diamond-like carbon). In the embodiment of FIG. 10, the liner material 132 may be a non-conductive material. In still other embodiments, no liner material 132 may be present in an interposer 150. Although various embodiments of the use of liner material 132 are depicted in FIGS. 9 and 10 and discussed with respect to their presence in an interposer 150, this is simply for ease of illustration, and DB interfaces 180 of microelectronic components 102 may also include liner materials 132 (e.g., only around the DB contacts 110, and/or around lines and vias in a metallization stack of the microelectronic component 102).

In some embodiments, lithographic via techniques may be used to form one or more layers of metallization in an interposer 150 (e.g., in an organic interposer 150) or a microelectronic component 102. For example, FIG. 11 illustrates a portion of an interposer 150 and its DB interface 180. In the embodiment of FIG. 11, three different layers of insulating material 106 are shown (labeled as 106A, 106B, and 106C). Within the "top" layer 106A (the layer closest to the DB interface 180), vias 116 may be patterned using lithographic techniques (e.g., "zero-misalignment" techniques) so that their side faces are aligned with side faces of the lines 114 on which they land. In "lower" layers (e.g., the layer 106B), vias 116 may be patterned using conventional techniques and the side faces of the vias 116 may not align with side faces of the lines 114 on which they land. More generally, a via 116 formed lithographically may have any desired footprint (e.g., a non-circular footprint). In the embodiment of FIG. 11, the DB contacts 110 may be "pads" in conductive contact with the vias 116 of the layer 106A. The use of lithographic via techniques in the formation of the DB interface 180 may result in an extremely flat DB interface 180 due to the planarization (e.g., chemical mechanical polishing) operations performed during lithographic via fabrication, and flat DB interfaces 180 may more reliably form direct bonds than more "uneven" DB interfaces 180. Thus, the use of lithographic via techniques to form the DB contacts 110 of a DB interface 180 may support a mechanically and electrically reliable DB region 130.

In some embodiments, lithographic via techniques to be used to form the DB contacts 110 in a DB interface 180 of an interposer 150 (e.g., in an organic interposer 150) or a microelectronic component 102. For example, FIG. 12 illustrates a portion of an interposer 150 and its DB interface 180. In the embodiment of FIG. 12, a DB contact 110 includes a via 116 and a line 114 on which the via 116 lands; these vias 116 may be patterned using lithographic techniques (e.g., so that the side faces of the vias 116 are aligned with side faces of the lines 114 on which they land). The DB dielectric 108 may contact the vias 116 and lines 114 of the DB contacts 110, as shown. Metallization in the insulating material 106 may be patterned using lithographic techniques or conventional techniques. Although various embodiments of vias 116/lines 114 are depicted in FIGS. 11 and 12 and discussed with respect to their presence in an interposer 150, this is simply for ease of illustration, and DB interfaces 180 of microelectronic components 102 may also include lithographically patterned vias 116/lines 114 in the DB interfaces 180 and/or the other metallization.

Figure 13:
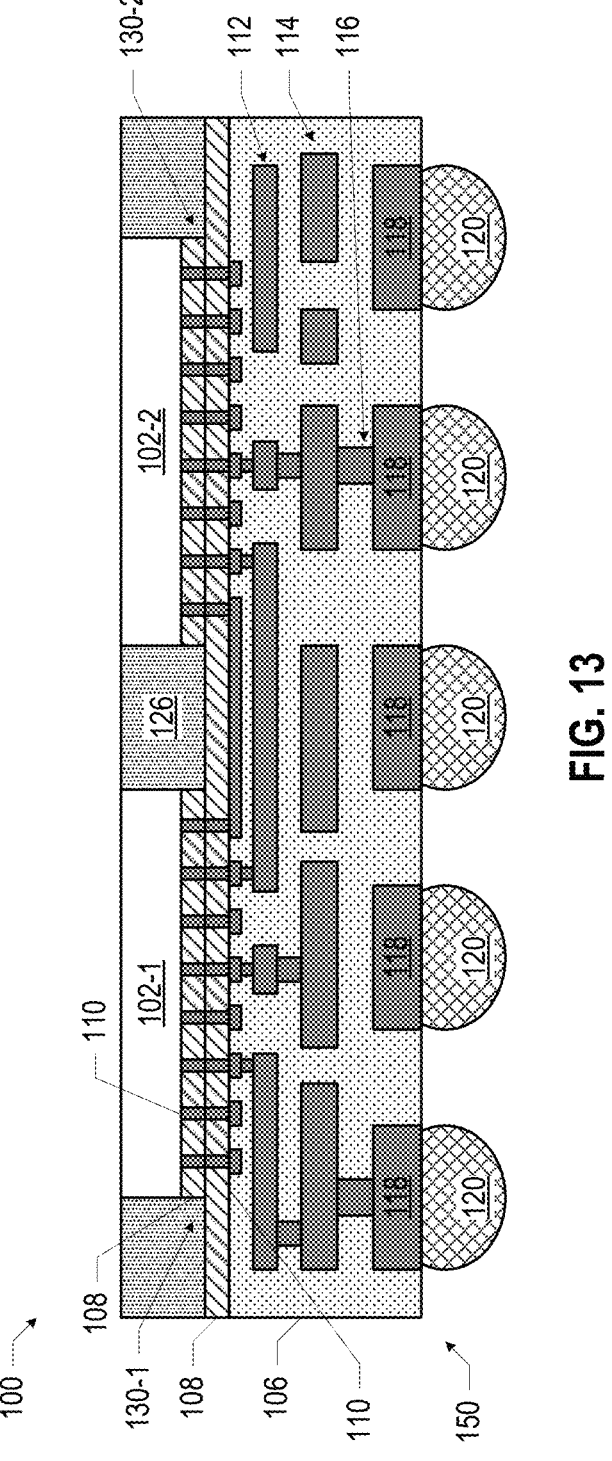
FIG. 13 is a side, cross-sectional view of an example microelectronic assembly including direct bonding, in accordance with various embodiments.

In the embodiment of FIGS. 1 and 2, the DB contacts 110 are shown as pads in contact with vias 116 in the underlying insulating material 106. In other embodiments, the DB contacts 110 may be vias themselves. For example, FIG. 13 illustrates an embodiment in which the DB contacts 110 are vias in contact with pads in the insulating material 106; as shown, the DB contacts 110 may be narrower than the pads with which they are in contact.

The microelectronic assembly 100 of FIGS. 1 and 2, and others of the microelectronic assemblies 100 disclosed herein, may be manufactured in any suitable manner. For example, FIGS. 14-17 are side, cross-sectional views of example stages in the manufacture of a portion of the microelectronic assembly 100 of FIGS. 1 and 2, in accordance with various embodiments. Although the operations discussed with reference to FIGS. 14-17 may be illustrated with reference to particular embodiments of the microelectronic assemblies 100 disclosed herein, the manufacturing methods discussed with reference to FIGS. 14-17 may be used to form any suitable microelectronic assemblies 100. Operations are illustrated once each and in a particular order in FIGS. 14-17, but the operations may be reordered and/or repeated as desired (e.g., with different operations performed in parallel when manufacturing multiple microelectronic assemblies 100 simultaneously). The manufacturing processes discussed below with reference to FIGS. 14-17 may be particularly advantageous when the interposer 150 is an organic interposer, and may also be advantageous for glass-based or semiconductor-based interposers (e.g., glass-based or silicon-based interposers in which the underlying glass or silicon wafer has already been thinned, and TSVs formed, before any direct bonding operations). However, any suitable manufacturing processes may be used to manufacture any of the microelectronic assemblies 100 disclosed herein.

Figure 14:
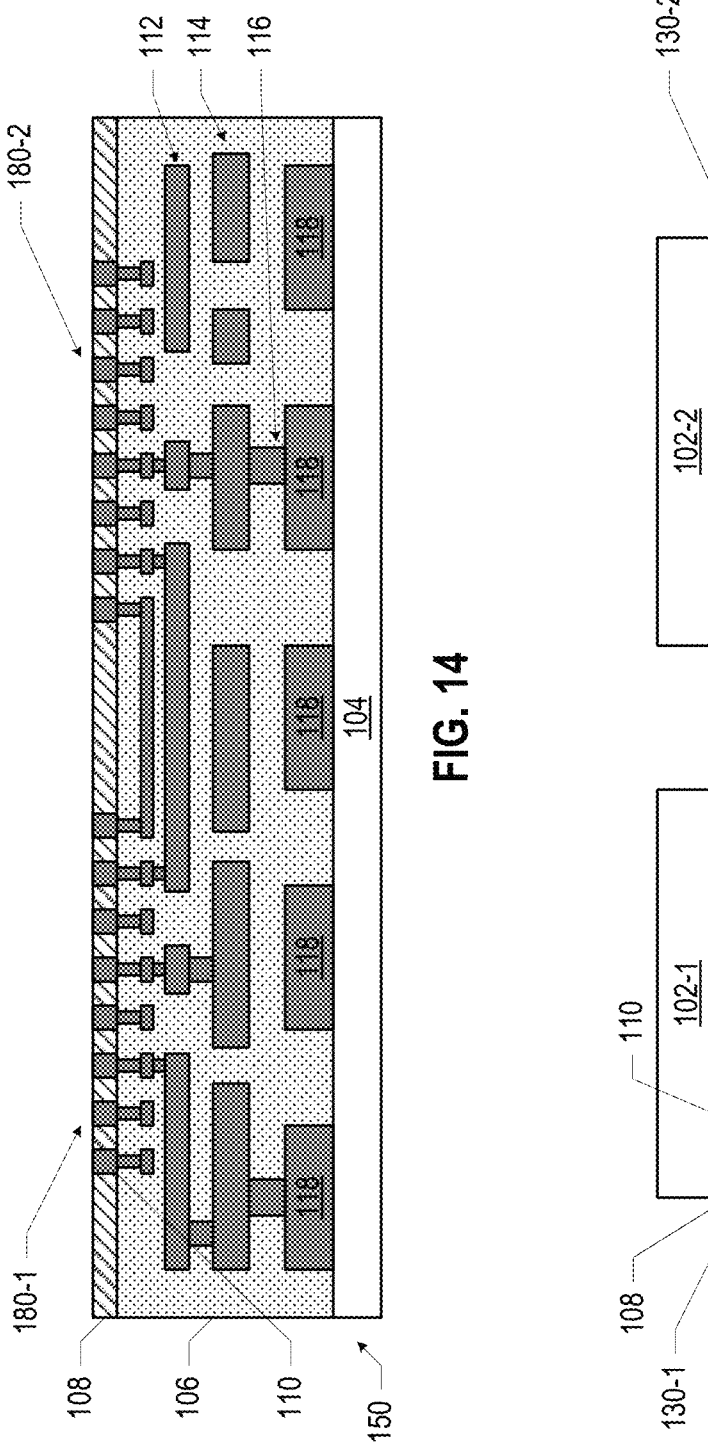
FIGS. 14-17 are side, cross-sectional views of example stages in the manufacture of a portion of the microelectronic assembly of FIGS. 1 and 2, in accordance with various embodiments.

FIG. 14 illustrates an assembly including an interposer 150 mounted on a carrier 104. The interposer 150 includes two exposed DB interfaces 180-1 and 180-2. The carrier 104 may include any suitable material, and in some embodiments, may include a semiconductor wafer (e.g., a silicon wafer) or glass (e.g., a glass panel). When the interposer 150 is an organic interposer, the interposer 150 may be advantageously manufactured on the carrier 104, which may provide a mechanically stable surface on which the layers of the interposer 150 may be formed.

Figure 15:
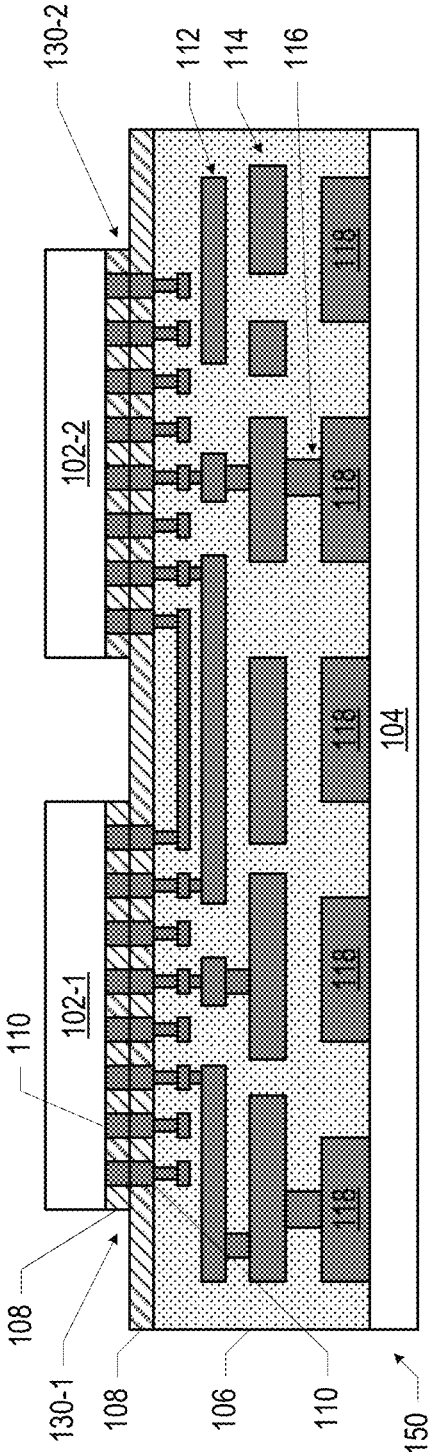

FIG. 15 illustrates an assembly subsequent to direct bonding microelectronic components 102-1 and 102-2 to the interposer 150/carrier 104 of FIG. 14. In particular, DB interfaces 180 (not labeled) of the microelectronic components 102 may be brought into contact with the DB interfaces 180 of the interposer 150, and heat and/or pressure to be applied to bond the contacting DB interfaces 180 to form DB regions 130 (with DB regions 130-1 and 130-2 corresponding to the DB interfaces 180-1 and 180-2, respectively).

Figures 16, 17:
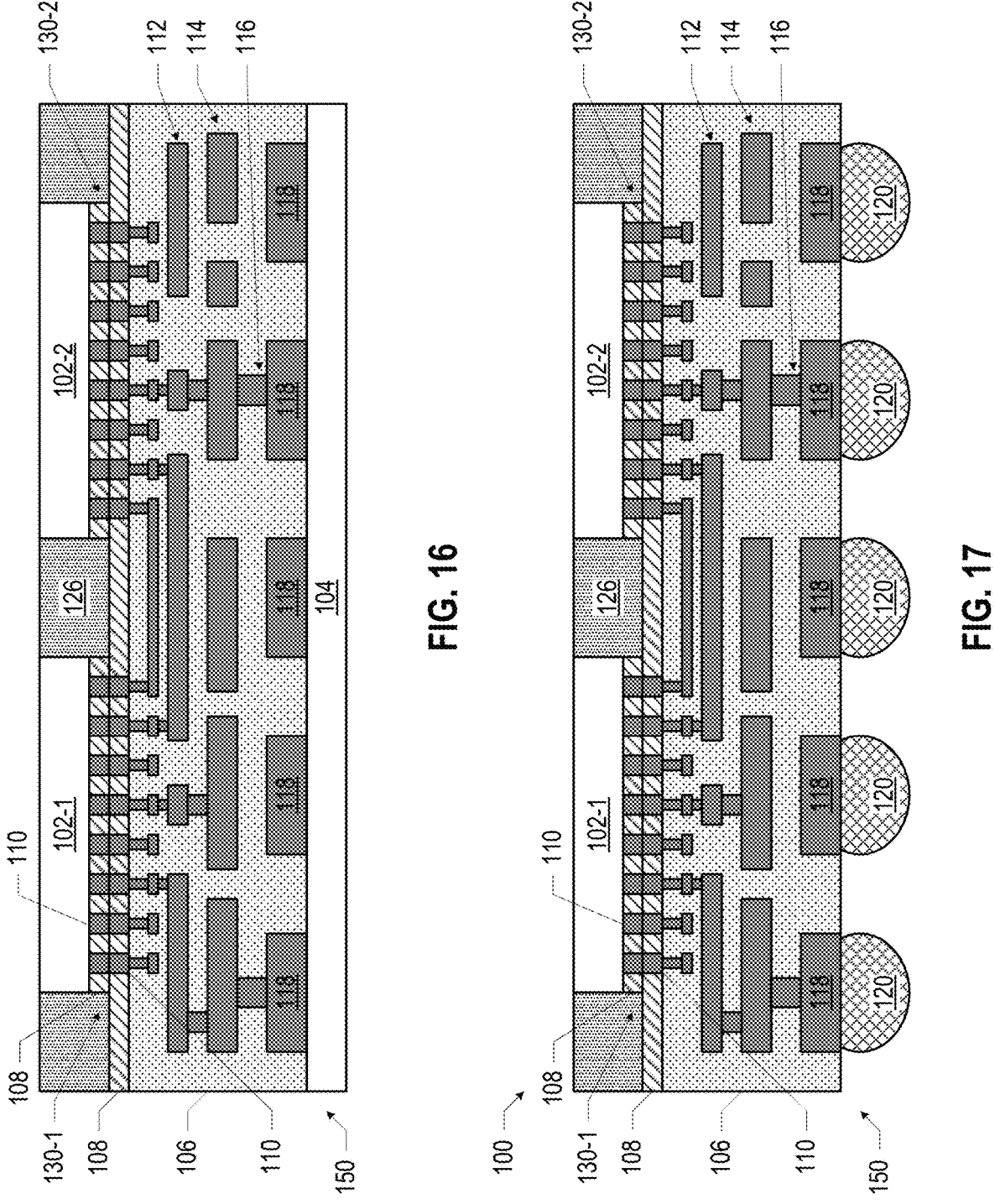

FIG. 16 illustrates an assembly subsequent to providing a mold material 126 around the microelectronic components 102 and on the surface of the interposer 150 of the assembly of FIG. 15. In some embodiments, the mold material 126 may extend above and remain above the microelectronic components 102, while in other embodiments, the mold material 126 may be polished back to expose the top surfaces of the microelectronic components 102, as shown.

FIG. 17 illustrates an assembly subsequent to removing the carrier 104 from the assembly of FIG. 16, and providing solder 120 on the newly exposed conductive contacts 118. The assembly of FIG. 17 may itself be a microelectronic assembly 100, as shown. Further manufacturing operations may be performed on the microelectronic assembly 100 of FIG. 17 to form other microelectronic assemblies 100; for example, the solder 120 may be used to couple the microelectronic assembly 100 of FIG. 17 to a support component 182, and a TIM 154 and heat transfer structure 152 may be provided on the top surface of the microelectronic assembly 100 of FIG. 17, forming the microelectronic assembly 100 of FIGS. 1 and 2.

Different DB regions 130 in a microelectronic assembly 100 may include different DB dielectrics 108. In some embodiments, the density of the DB contacts 110 (i.e., the proportion of the area of a bonding surface of a DB interface 180 occupied by DB contacts 110) may differ between different DB regions 130. In some embodiments, this differing density may be due to one DB region 130 requiring fewer electrical pathways than another DB region 130. In other embodiments, this differing density may be used to enhance or suppress heat transfer, with greater density of DB contacts 110 (and therefore a higher proportion of thermally conductive metal) being used to enhance heat transfer and lesser density of DB contacts 110 (and therefore a lower portion of thermally conductive metal) being used to suppress heat transfer. In the embodiment of FIGS. 1 and 2, the DB dielectric 108 extends outside of the DB regions 130, covering the remainder of the top surface of the interposer 150. In other embodiments, a different material may be disposed at the top surface of the interposer 150 outside of the DB regions 130. Although various ones of the accompanying drawings illustrate DB regions 130 at a single surface of the interposer 150 (e.g., the top surface), a microelectronic assembly 100 may include DB regions 130 at multiple surfaces of an interposer 150.

Figure 18A:
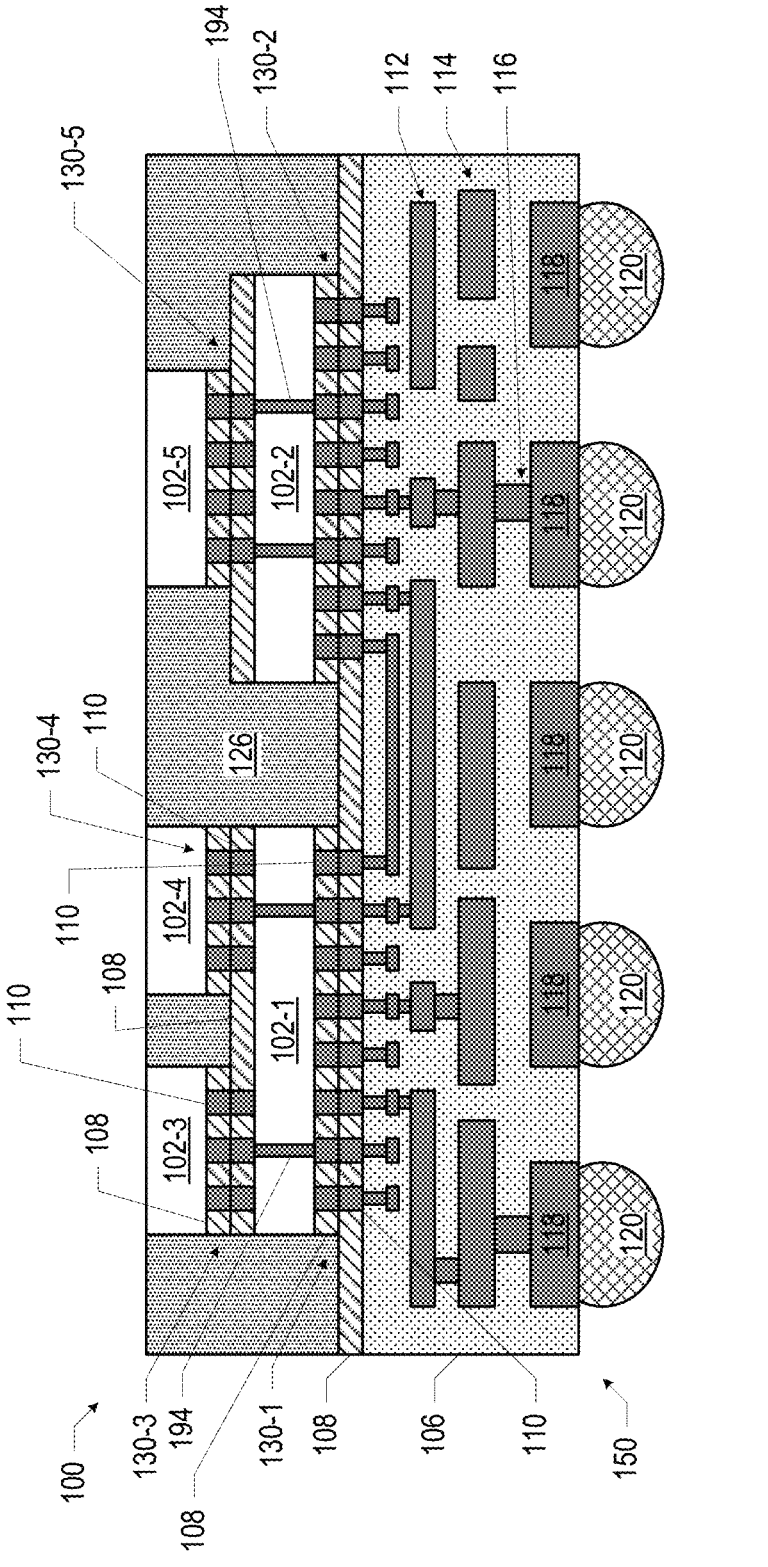
FIGS. 18A-18B are side, cross-sectional views of example microelectronic assemblies including direct bonding, in accordance with various embodiments.
Figure 18B:
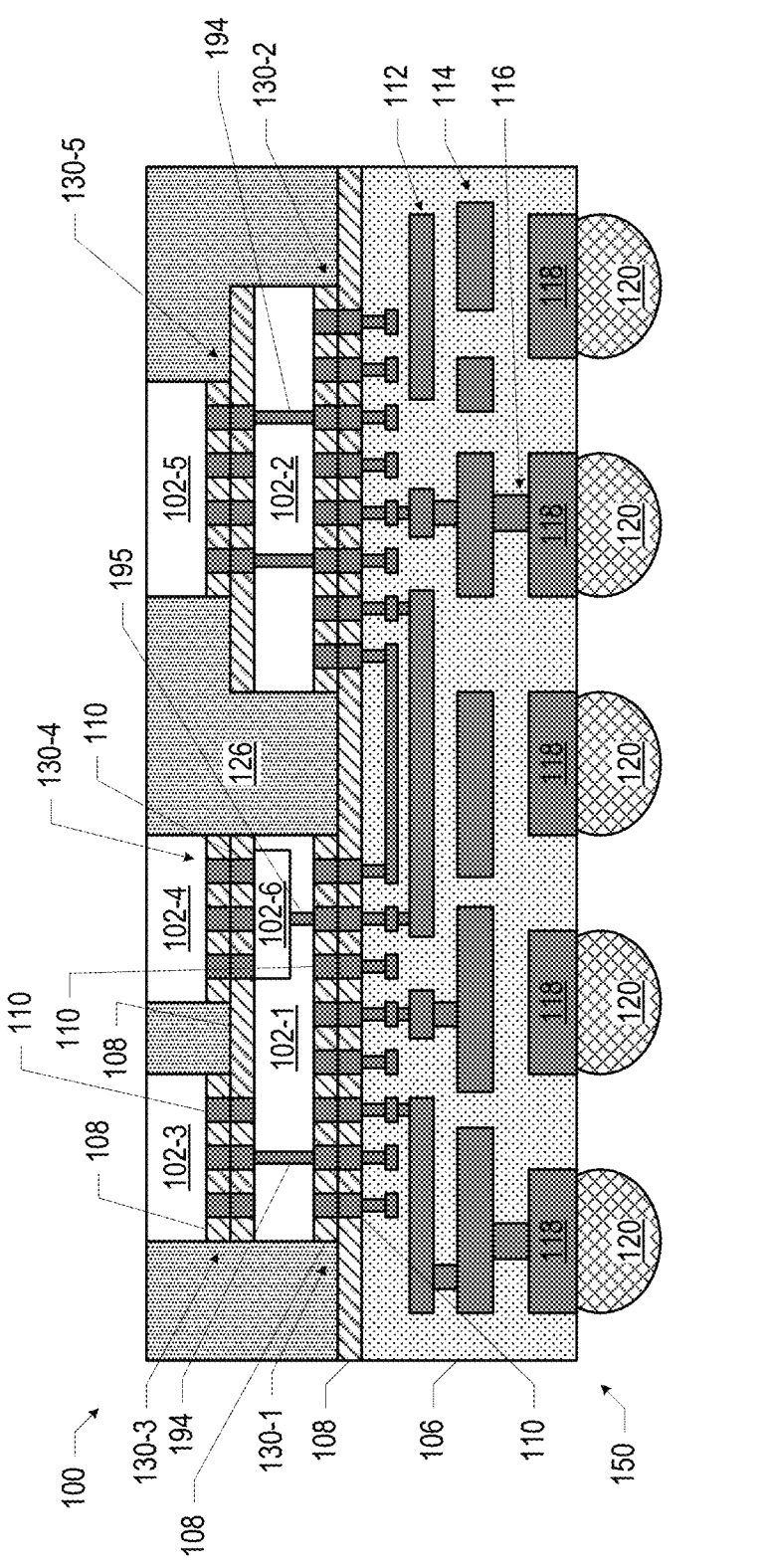

A microelectronic assembly 100 may include multiple "tiers" of microelectronic components 102 coupled by direct bonding. For example, FIGS. 18A and 18B illustrate microelectronic assemblies 100 in which a microelectronic component 102-1 includes two DB interfaces 180 (not labeled) at its top surface, and microelectronic components 102-3 and 102-4 with their own DB interfaces 180 (not labeled) at the bottom surfaces are coupled to the microelectronic component 102-1 via DB regions 130-3 and 130-4, respectively. Similarly, the microelectronic component 102-2 includes a DB interface 180 (not labeled) at its top surface, and a microelectronic component 102-5 with its own DB interface 180 (not labeled) at its bottom surface is coupled to the microelectronic component 102-2 via a DB region 130-5. The microelectronic assemblies 100 of FIG. 18 may thus be described as having two tiers of direct bonded microelectronic components 102. The microelectronic assemblies 100 of FIGS. 18A and 18B share many features, and FIG. 18B illustrates a particular embodiment in which the microelectronic component 102-1 includes an embedded microelectronic component 102-6 (e.g., an embedded die), and the DB region 130-4 is at the top face of the embedded microelectronic component 102-6. In some embodiments, the embedded microelectronic component 102-6 may be a higher density component and the microelectronic component 102-1 may be a lower density component. The microelectronic component 102-1 may include one or more conductive structures 195 that conductively couple contacts (not shown) at the bottom surface of the embedded microelectronic component 102-6 to the DB contacts 110 at the bottom surface of the microelectronic component 102-1. More generally, any microelectronic component 102 disclosed herein may include one or more dies and may have different types of pass-through conductive interconnects, such as copper pillars and TSVs (e.g., through-silicon vias).

In some embodiments, the microelectronic components 102-1 and 102-2 in the first tier of the microelectronic assembly 100 of FIG. 18 may include conductive structures 194 that extend between the DB regions 130 at their top and bottom surfaces, providing conductive pathways for power, ground, and/or signals to the microelectronic components 102 in the second tier (i.e., the microelectronic components 102-3, 102-4, and 102-5). In some embodiments, such a conductive structure 194 may include one or more TSVs, including a conductive material via, such as a metal via, isolated from the surrounding silicon or other semiconductor material by a barrier oxide), such as through-silicon vias when the microelectronic components 102-1 and 102-2 include silicon substrates or through-glass vias when the microelectronic components 102-1 and 102-2 include glass substrates. In some embodiments, the microelectronic components 102-1 and 102-2 in a first tier may be passive (e.g., including no transistors) or active (e.g., including transistors in the form of memory circuitry and/or power delivery circuitry).

In the embodiment of FIG. 18, a mold material 126 may extend up to and may laterally surround the microelectronic components 102 in the second tier, and in some embodiments (not shown), the mold material 126 may cover the top surfaces of the microelectronic components 102 in the second tier. As shown in FIG. 18, in some embodiments, the top surface of the mold material 126 may be coplanar with the exposed DB interfaces 180. In some embodiments, a microelectronic assembly 100 including exposed DB interfaces 180 may have a temporary, removable protective material (e.g., an adhesive material, not shown) on the exposed DB interfaces 180 to protect them until direct bonding operations are performed. Microelectronic assemblies 100 including multiple tiers of microelectronic components 102 may be formed in a manner discussed above with reference to FIGS. 14-17, with the additional tiers of microelectronic components 102 coupled to the preceding assemblies prior to deposition of the mold material 126. In some other embodiments, a microelectronic assembly 100 including multiple tiers of microelectronic components 102 may be formed by first assembling the tiers of microelectronic components 102, and then coupling the assembled tiers to an interposer 150 as discussed above with reference to FIG. 15. A microelectronic assembly 100 may not be limited to two tiers of microelectronic components 102, but may include three or more tiers, as desired. Further, although the microelectronic components 102 in an individual tier in FIG. 18 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 18, no microelectronic component 102-5 may be present on top of the microelectronic component 102-2 (and thus the microelectronic component 102-2 may not include conductive structures 194 (e.g., may not include TSVs)).

In the embodiment of FIG. 18, a mold material 126 may extend up to and may laterally surround the microelectronic components 102 in the second tier, and in some embodiments (not shown), the mold material 126 may cover the top surfaces of the microelectronic components 102 in the second tier.

In some embodiments, a microelectronic assembly 100 may include one or more inductors or transformers at least partially in a DB region 130. In some such embodiments, one component of the microelectronic assembly 100 (e.g., an interposer 150 or a microelectronic component 102) may include a portion of an inductor in its DB interface 180, and another component of the microelectronic assembly 100 (e.g., another microelectronic component 102) may include another portion of the inductor in its DB interface 180; when the DB interfaces 180 of the components are bonded together to form a DB region 130, the inductor may be complete.

Figures 19, 20, 21, 22, 23, 24, 25:
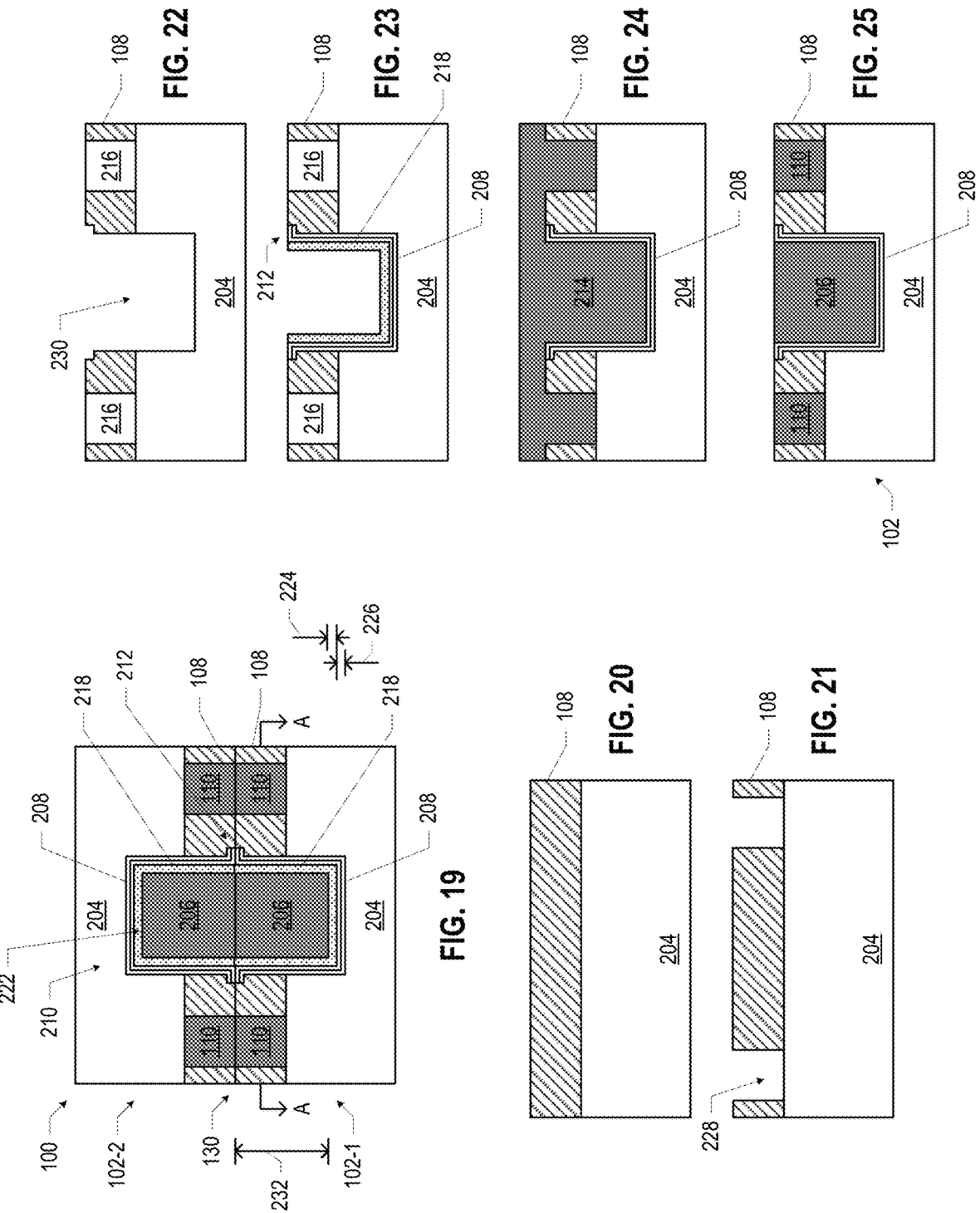
FIG. 19 is a side, cross-sectional view of an example microelectronic assembly including a direct bonding region with an inductor, in accordance with various embodiments.
FIGS. 20-25 are side, cross-sectional views of example stages in the manufacture of the microelectronic assembly of FIG. 19, in accordance with various embodiments.

FIG. 19 is a side, cross-sectional view of a portion of a microelectronic assembly 100 that includes two microelectronic components 102 coupled by a DB region 130; an inductor 210 is at least partially disposed in the DB region 130 that also includes other DB contacts 110 in a DB dielectric 108. FIGS. 20-32 share the perspective of FIG. 19. Although FIG. 19 and others of the accompanying drawings depict inductors 210 in a DB region 130 between two microelectronic components 102, this is simply for ease of illustration, and an inductor 210 may be included in a DB region 130 between any two components (e.g., an interposer 150 and a microelectronic component 102, etc.). The microelectronic components 102 of FIG. 19 and others of the accompanying drawings may be referred to as the lower microelectronic component 102-1 and the upper microelectronic component 102-2, but the use of the terms "lower" and "upper" is simply for ease of illustration, and no desired or required orientation is implied. Also, FIG. 19 and others of the accompanying drawings illustrate microelectronic components 102 including a DB interface 180 and a remaining structure 204; this remaining structure 204 may include any of the embodiments of the materials of the interposer 150, such as the insulating material 106 and the conductive pathways 112, or any other metallization stacks and/or device layers disclosed herein). In particular, the remaining structure 204 of a microelectronic component 102 may include conductive pathways (not shown) to electrically connect the inductor 210 to other circuitry (e.g., voltage regulators circuitry, as discussed below with reference to FIG. 41).

The inductor 210 of FIG. 19 includes an inductor trace 222 spaced apart from a magnetic region 208 by a dielectric region 218. The inductor trace 222, the dielectric region 218, and the magnetic region 208 may each include a portion contributed by one microelectronic component 102 of the microelectronic assembly 100 and a portion contributed by the other microelectronic component 102 of the microelectronic assembly 100. For example, the inductor trace 222 includes inductor trace material 206 (e.g., copper) at each of the DB interfaces 180; similarly, the dielectric region 218 and the magnetic region 208 include materials at each of the DB interfaces 180. In the embodiment of FIG. 19, these contributions to the inductor 210 are symmetric, but in other embodiments, the contributions may not be symmetric (e.g., as discussed below with reference to FIG. 26).

The inductor trace material 206 of a microelectronic component 102 may bond to the inductor trace material 206 of the other microelectronic component 102 to form the inductor trace 222. In some such embodiments, the inductor trace material 206 may include any of the materials discussed herein with reference to the DB contacts 110. In other embodiments, the microelectronic components 102 may each provide inductor trace material 206 to an inductor 210, but the inductor trace material 206 of different microelectronic components 102 may remain spaced apart, providing separate inductor traces 222 (e.g., as discussed below with reference to FIGS. 29-30); in such embodiments, the inductor trace material 206 of different microelectronic components 102 may not bond together, and may include any suitable conductive materials (e.g., any suitable metals). In some embodiments, the inductor trace material 206 contributed by a microelectronic component 102 to an inductor 210 may have a thickness 232 between 0.1 microns and 10 microns (e.g., between 0.1 microns and 1 micron, or between 1 micron and 6 microns).

The dielectric region 218 may at least partially surround the inductor trace 222. The portions of the dielectric region 218 contributed by each microelectronic component 102 may have a U-shaped cross-section, as shown. In some embodiments, a thickness 224 of the dielectric region 218 may be between 0.01 microns and 2 microns. Any suitable dielectric material may be included in the dielectric region 218. For example, in some embodiments, the dielectric region 218 may include aluminum and nitrogen (e.g., in the form of aluminum nitride).

The magnetic region 208 may at least partially surround the inductor trace 222, and as noted above, may be spaced apart from the inductor trace 222 by the dielectric region 218. The portions of the magnetic region 208 contributed by each microelectronic component 102 may have a U-shaped cross-section, as shown, and in some embodiments, may have a lip portion 212 that extends parallel to the bonding surface of the DB interface 180. The lip portion 212 may increase the inductance of an inductor 210, relative to embodiments in which no lip portion 212 is present, by providing a "magnetic via" between the portions of the magnetic region 208 provided by the different microelectronic components 102.

In some embodiments, a thickness 226 of the magnetic region 208 may be between 0.01 microns and 1 micron. In some embodiments, the magnetic region 208 may include thin layers of magnetic material that alternate with thin layers of dielectric material; these individual layers may have a U-shaped cross-section and may at least partially surround the inductor trace 222. Such layering may help reduce eddy currents and may improve the quality factor of the inductor 210. In some embodiments, the magnetic material may include nickel and iron (e.g., in the form of a permalloy), or may include cobalt, zirconium, and tantalum (e.g., in the form of cobalt tantalum zirconium), or may include cobalt, zirconium, tantalum, and boron, and an individual thin layer of magnetic material may have a thickness between 10 nanometers and 200 nanometers (e.g., between 10 nanometers and 100 nanometers, or between 20 nanometers and 40 nanometers). In some embodiments, the individual thin layers of magnetic material in a magnetic region 208 may be electrically conductive. In some embodiments, the thin layers of dielectric material included in a magnetic region 208 may include any suitable dielectric material (e.g., aluminum and nitrogen (e.g., in the form of aluminum nitride)), and an individual thin layer of dielectric material may have a thickness that is less than 1 micron.

A microelectronic assembly 100 like that of FIG. 19 may be fabricated by separately forming the microelectronic components 102, and then performing a direct bonding operation to form the DB region 130 (and thus completing the inductor 210). A microelectronic component 102 like those of FIG. 19 may be manufactured using any suitable technique. For example, FIGS. 20-25 are side, cross-sectional views of stages in an example process for manufacturing a microelectronic component 102 including a portion of an inductor 210. Although FIGS. 20-25 illustrate a process for manufacturing the particular microelectronic component 102 illustrated in FIG. 19, processes like those illustrated by FIGS. 20-25 may be used to form any of the microelectronic components 102 including a portion of an inductor 210 disclosed herein (e.g., any of the inductors 210 discussed below with reference to FIGS. 26-40).

FIG. 20 illustrates an assembly including a DB dielectric 108 on the remaining structure 204 of a microelectronic component 102. The DB dielectric 108 and the remaining structure 204 may take any of the forms disclosed herein.

FIG. 21 illustrates an assembly subsequent to forming recesses 228 in the DB dielectric 108 of the assembly of FIG. 20; the recesses 228 may correspond to the location of the DB contacts 110, and may expose conductive pathways (not shown) in the remaining structure 204.

FIG. 22 illustrates an assembly subsequent to filling the recesses 228 of the assembly of FIG. 21 with a sacrificial material 216, and then forming a deeper recess 230 in the DB dielectric 108 (and possibly past the DB dielectric 108 and into the remaining structure 204). The recess 230 may correspond to the inductor 210, as discussed below. Note that the recess 230 may include a portion corresponding to the lip portion 212 of the magnetic region 208, as discussed above with reference to FIG. 19. In some embodiments, a dual Damascene process may be used to form the recess 230.

FIG. 23 illustrates an assembly subsequent to forming a conformal magnetic region 208 in the recess 230 of the assembly of FIG. 22, and forming a dielectric region 218. The magnetic region 208 may include a lip portion 212, as shown. As discussed above, the magnetic region 208 may be formed by depositing alternating conformal layers of magnetic material and dielectric material in the recess 230. The dielectric region 218 may be formed by conformally depositing one or more dielectric materials in the recess 230 over the magnetic region 208. In some embodiments, deposition of the materials for the magnetic region 208 and the dielectric region 218 may be followed by a planarization operation (e.g., chemical mechanical polishing (CMP)) to remove these materials from above the sacrificial material 216/DB dielectric 108.

FIG. 24 illustrates an assembly subsequent to removing the sacrificial material 216 from the assembly of FIG. 23, and depositing a conductive material 214. The conductive material 214 may fill the remainder of the recess 230 as well as the recesses 228, with the conductive material 214 in the recess 230 corresponding to the inductor trace material 206, and the conductive material 214 in the recesses 228 corresponding to the DB contacts 110. In some embodiments, the conductive material 214 may be deposited using an electroplating technique. In embodiments in which the inductor trace material 206 has a different material composition than the DB contacts 110, material for the inductor trace material 206 may be deposited before the sacrificial material 216 is removed, material may be planarized, the sacrificial material 216 may be removed, and then the material for the DB contacts 110 may be deposited.

FIG. 25 illustrates an assembly subsequent to planarizing the assembly of FIG. 24 to remove the conductive material 214 above the DB dielectric 108. The resulting assembly may take the form of the microelectronic component 102 of FIG. 19, including the DB contacts 110 and the inductor trace material 206.

Figures 26, 27, 28, 29:
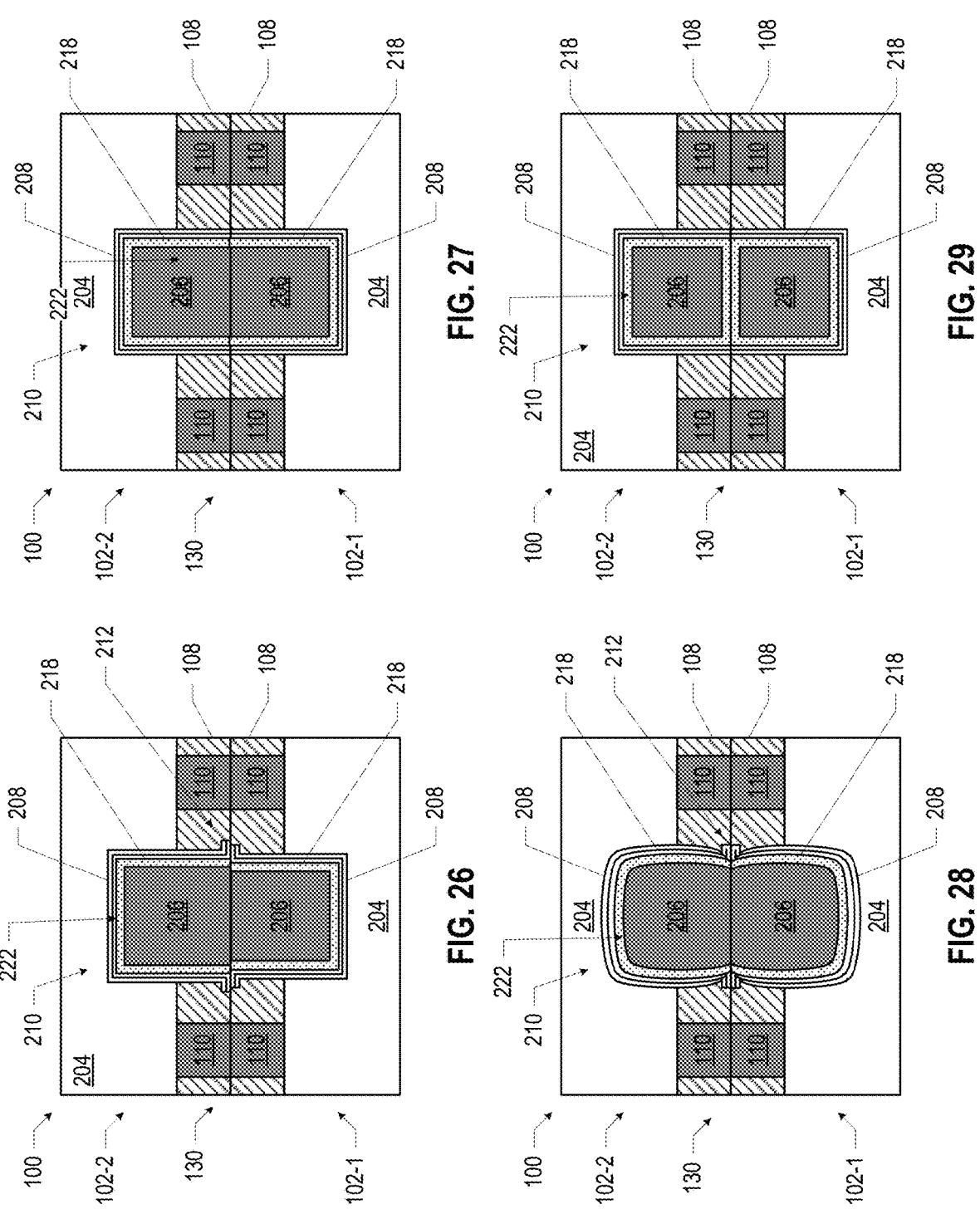
FIGS. 26-32 are side, cross-sectional views of example microelectronic assemblies including direct bonding regions with inductors, in accordance with various embodiments.

As noted above, in some embodiments, an inductor 210 included in a DB region 130 of a microelectronic assembly 100 may not be symmetric about the DB bonding interface. For example, FIG. 26 illustrates an embodiment in which portions of the inductor trace material 206, the magnetic region 208, and the dielectric region 218 contribute by the upper microelectronic component 102-2 are larger than the corresponding portions of the inductor trace material 206, the magnetic region 208, and the dielectric region 218 contributed by the lower microelectronic component 102-1. Having differently sized inductor trace material 206, magnetic regions 208, and/or dielectric regions 218 contributed by the different microelectronic components 102 may render the inductance of the inductor 210 more robust to misalignments and other non-idealities that arise during manufacturing.

In some embodiments, the magnetic region 208 may not include a lip portion 212. For example, FIG. 27 illustrates an embodiment in which no lip portion 212 is present.

The microelectronic assemblies 100 of FIGS. 19, 26, and 27 illustrate embodiments in which the walls of the inductors 210 are substantially straight. In other embodiments, the walls of the inductor 210 (e.g., the magnetic region 208 and the dielectric region 218) may be curved. For example, FIG. 28 illustrates an embodiment in which the walls of the inductor 210 are curved. And inductor 210 having curved walls may allow a higher inductance to be achieved and may reduce eddy current losses, but may incur a higher DC resistance.

Figures 30, 31, 32:
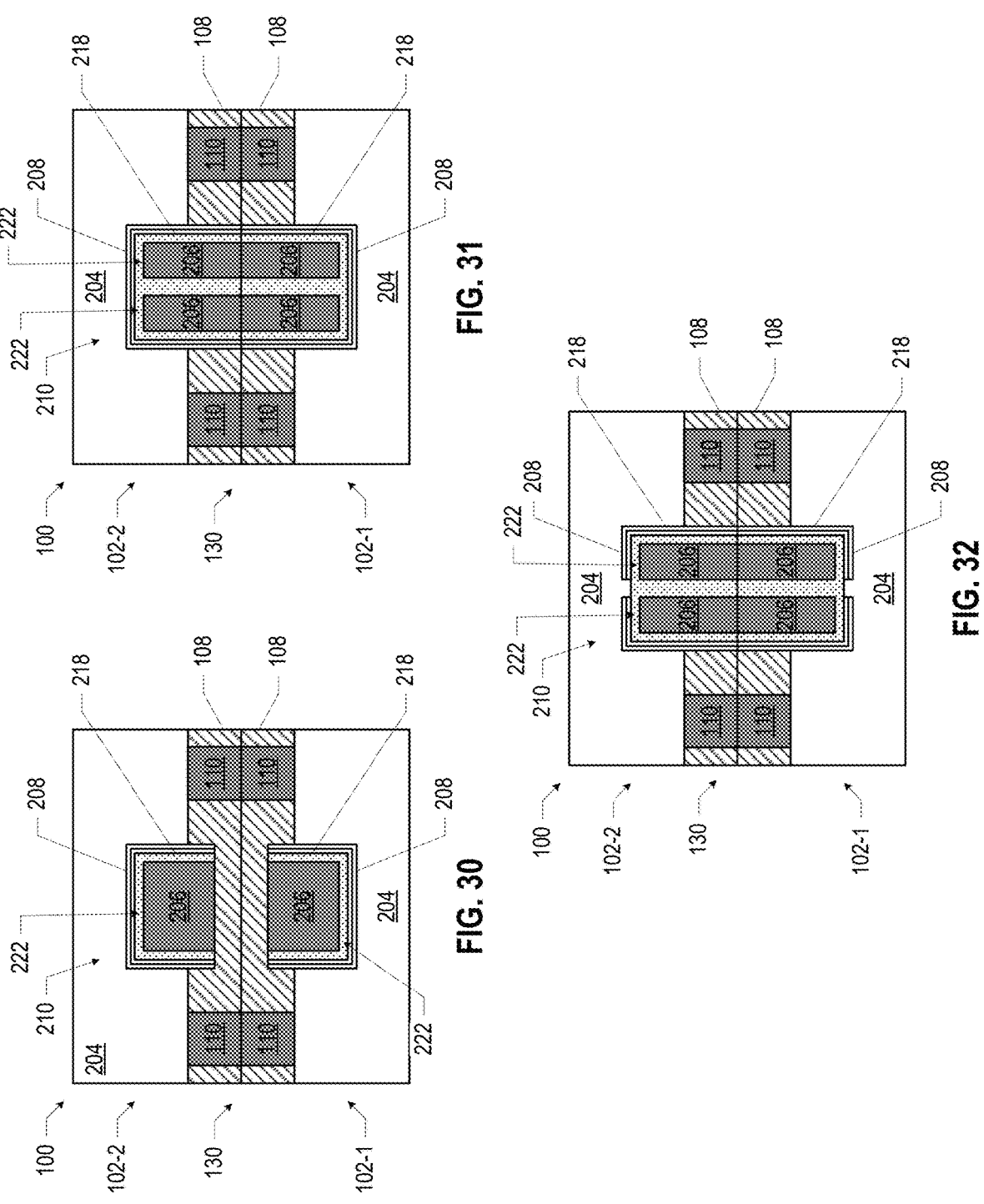

As noted above, in some embodiments, the inductor trace material 206 contributed by each of the microelectronic components 102 in a microelectronic assembly 100 may not be in contact with each other, and thus may form separate inductor traces 222. For example, FIG. 29 illustrates an embodiment in which an inductor 210 includes two inductor traces 222 in the DB region 130, with different inductor traces 222 provided by different microelectronic components 102 and spaced apart by intervening material of a dielectric region 218. Both inductor traces 222 in the embodiment of FIG. 29 are least partially surrounded by the dielectric region 218 and the magnetic region 208. Similarly, an inductor 210 may include different portions of dielectric region 218 and magnetic region 208 in the different microelectronic components 102, and the different portions may not be in contact; FIG. 30 illustrates an embodiment in which the microelectronic components 102 each contribute a portion of inductor trace material 206, dielectric region 218, and magnetic region 208, but the portions in one microelectronic component 102 are spaced apart from the portions in the other microelectronic component 102 (e.g., by intervening DB dielectric 108). Having multiple inductor traces 222 within a magnetic "envelope" provided by a magnetic region 208 may increase the saturation current supported by the inductor 210.

In some embodiments, each microelectronic component 102 may contribute multiple portions of inductor trace material 206 to an inductor 210 in a DB region 130. For example, FIG. 31 illustrates an embodiment in which each microelectronic component 102 contributes two separate portions of inductor trace material 206 to an inductor 210. More generally, microelectronic components 102 and a microelectronic assembly 100 may contribute two or more separate portions of inductor trace material 206 to an inductor 210.

In some embodiments, the magnetic region 208 and/or the dielectric region 218 may be discontinuous in an inductor 210 of a DB region 130. For example, FIG. 30, discussed above, illustrates an embodiment in which the magnetic region 208 and the dielectric region 218 are discontinuous, with one portion provided by the upper microelectronic component 102-2 and another portion provided by the lower microelectronic component 102-1. In other embodiments, a single microelectronic component 102 may provide discontinuous portions of the magnetic region 208 and/or the dielectric region 218. For example, FIG. 32 illustrates an embodiment in which the magnetic region 208 is discontinuous within the upper microelectronic component 102-2 and within the lower microelectronic component 102-1. Discontinuities in a magnetic region 208 of an inductor 210 may reduce eddy current losses and thereby improve the quality factor of the inductor 210 relative to embodiments in which the magnetic region 208 is substantially continuous.

Figures 33, 34, 35, 36:
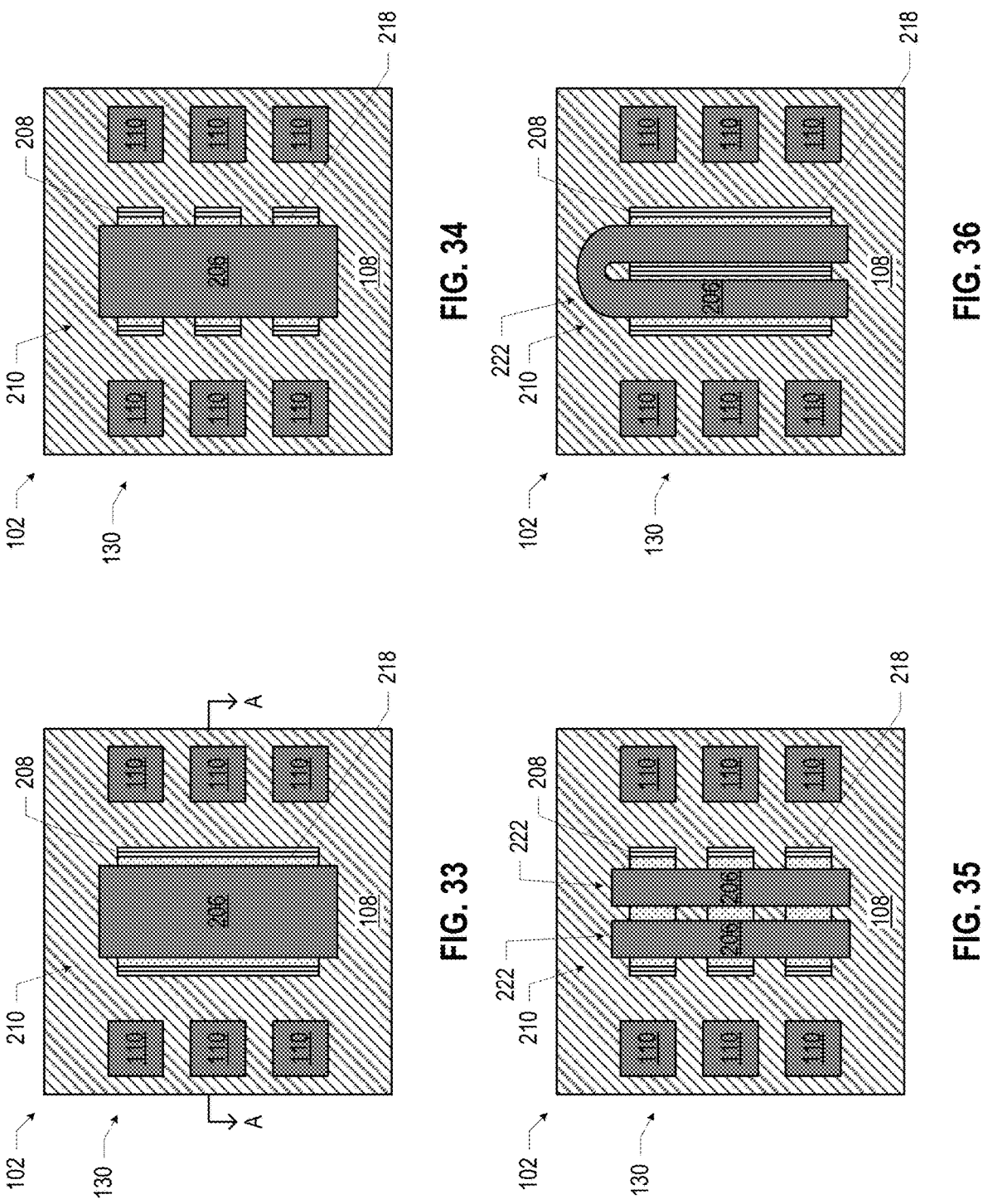
FIGS. 33-38 are top, cross-sectional views of example microelectronic assemblies including direct bonding regions with inductors, in accordance with various embodiments.

FIGS. 30 and 32 illustrate embodiments in which the magnetic region 208 and/or the dielectric region 218 are discontinuous when the inductor 210 is viewed in cross-section perpendicular to the longitudinal length of an inductor trace 222. In some embodiments, the magnetic region 208 and/or the dielectric region 218 may be discontinuous in a direction parallel to the longitudinal length of inductor trace 222. For example, FIG. 33 is a top, cross-sectional view of the lower microelectronic component 102-1 of the microelectronic assembly 100 of FIG. 19; the cross-section of FIG. 33 may correspond to the section A-A of FIG. 19, and the cross-section of FIG. 19 may correspond to the cross-section A-A of FIG. 33. FIGS. 34-38 share the perspective of FIG. 33. In the embodiment of FIG. 33, the magnetic region 208 and the dielectric region 218 are shown as being substantially continuous along the longitudinal length of the inductor trace 222. In contrast, FIG. 34 illustrates an embodiment in which the magnetic region 208 and the dielectric region 218 are shown as being discontinuous along the longitudinal length of the inductor trace 222; three portions of the magnetic region 208 and the dielectric region 218 are shown, but the magnetic region 208 and/or the dielectric region 218 may include any desired number of discontinuous portions. FIG. 35 illustrates an embodiment in which the magnetic region 208 and the dielectric region 218 are discontinuous along the longitudinal length of the inductor trace 222 (like the embodiment of FIG. 34) and in which there are multiple segments of an inductor trace 222 (e.g., as discussed above with reference to FIG. 31).

Figures 37, 38, 39, 40:
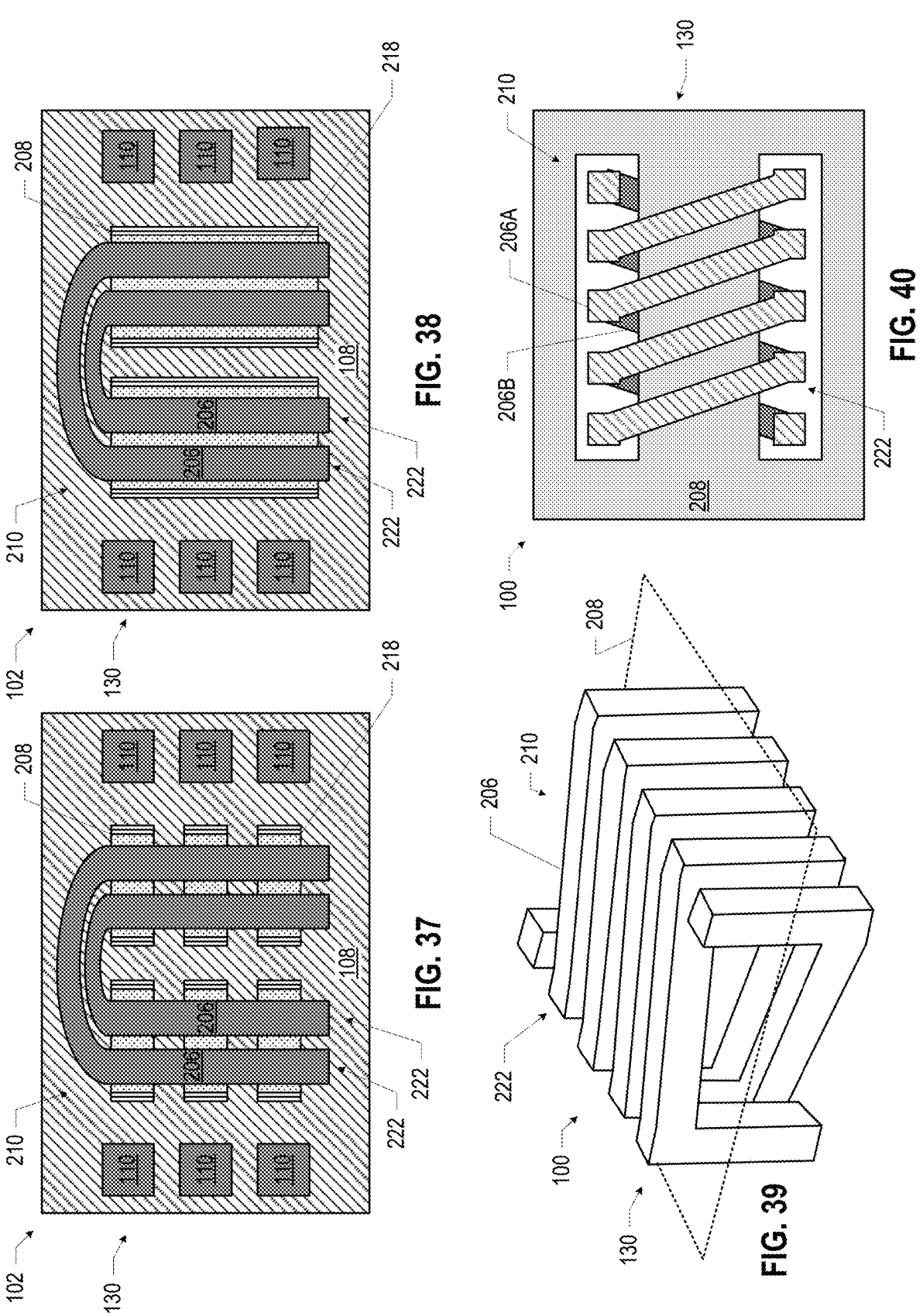
FIG. 39 is a perspective view of a helical coil inductor that may be included in a direct bonding region of a microelectronic assembly, in accordance with various embodiments.
FIG. 40 is a top view of a helical coil inductor that may be included in a direct bonding region of a microelectronic assembly, in accordance with various embodiments.

In some embodiments, an inductor trace 222 may contribute multiple "turns" to an inductor 210. For example, FIG. 36 is a top, cross-sectional view of a microelectronic component 102 including a single loop of inductor trace material 206 providing multiple segments at least partially surrounded by the magnetic region 208 and the dielectric region 218. More generally, an inductor 210 may include any desired number of inductor trace material 206 arranged in any desired number of turns. FIG. 37, for example, illustrates two portions of inductor trace material 206, each arranged with a single turn, and six discontinuous portions of the magnetic region 208 and the dielectric region 218, as shown. FIG. 38 illustrates an embodiment having the same arrangement of inductor trace material 206 of the embodiment of FIG. 37, but in which two sets of magnetic region 208/dielectric region 218 at least partially surround the turns of the portions of inductor trace material 206.

In some embodiments, a DB region 130 of a microelectronic assembly 100 may include at least a portion of a helical coil inductor 210. In such embodiments, some of the helical coil inductor 210 may be provided by one microelectronic component 102 in a microelectronic assembly 100 and some of the helical coil inductor 210 may be provided by the other microelectronic component 102 and a microelectronic assembly 100; the helical coil inductor 210 may be completed upon direct bonding of the microelectronic components 102, as discussed above with reference to FIG. 19. For example, FIG. 39 is a perspective view of a helical coil inductor 210 a may be included in a microelectronic assembly 100. A planar magnetic region 208 may extend through the middle of the helically arranged inductor trace material 206, and may extend outside of the helical arrangement of inductor trace material 206, as shown; in some embodiments, the planar magnetic region 208 may be located at the surface of a DB interface 180 of one or more of the microelectronic components 102 in the microelectronic assembly 100, while in other embodiments, multiple planar magnetic regions 208 (not shown) may extend to the middle of the helically arranged inductor trace material 206, with each planar magnetic region 208 included in the DB dielectric 108 but spaced apart from a bonding surface of the DB interface 180. FIG. 40 is a top view of an embodiment of a helical coil inductor 210 that may be included in a DB region 130 of a microelectronic assembly 100. In the particular embodiment of FIG. 40, a portion 206A of inductor trace material may be included in one of the microelectronic components 102, and a portion 206B of inductor trace material 206 may be included in the other of the microelectronic components 102, with the planar magnetic region 208 within the helical arrangement of inductor trace material 206 and outside of the helical arrangement of inductor trace material 206, as shown. Helical coil inductors 210 like those illustrated in FIGS. 39 and 40 may include only planar magnetic regions 208, and thus may be simpler to fabricate that embodiments in which the magnetic region 208 is non-planar however, the magnetic "loop" in such helical coil inductors 210 may be larger than the magnetic "loops" of the inductors 210 of FIGS. 19-38, and thus may achieve lower inductance.

An inductor 210 included in a DB region 130 may be part of any desired circuitry in a microelectronic assembly 100. In some embodiments, an inductor 210 may be part of voltage regulator circuitry. Such embodiments may be particularly advantageous in microelectronic assemblies 100 in which multiple different voltage domains are required (e.g., for multiple different regions in a single microelectronic component 102 and/or for multiple different microelectronic components 102). As electronics become smaller, reducing the distance between memory and logic devices may make it advantageous to arrange dies into heterogeneous multi-die stacks in which the dies and the stack serve different functions (e.g., logic, memory, voltage regulation, routing, etc.). In such stacks, power delivery may be extremely challenging, as each die typically operates at a different voltage and/or current to achieve the best possible overall performance per watt. The inductors 210 disclosed herein may be included in on-die voltage regulator circuitry to achieve high efficiency voltage conversion without the large area requirement of previous approaches.

Figure 41:
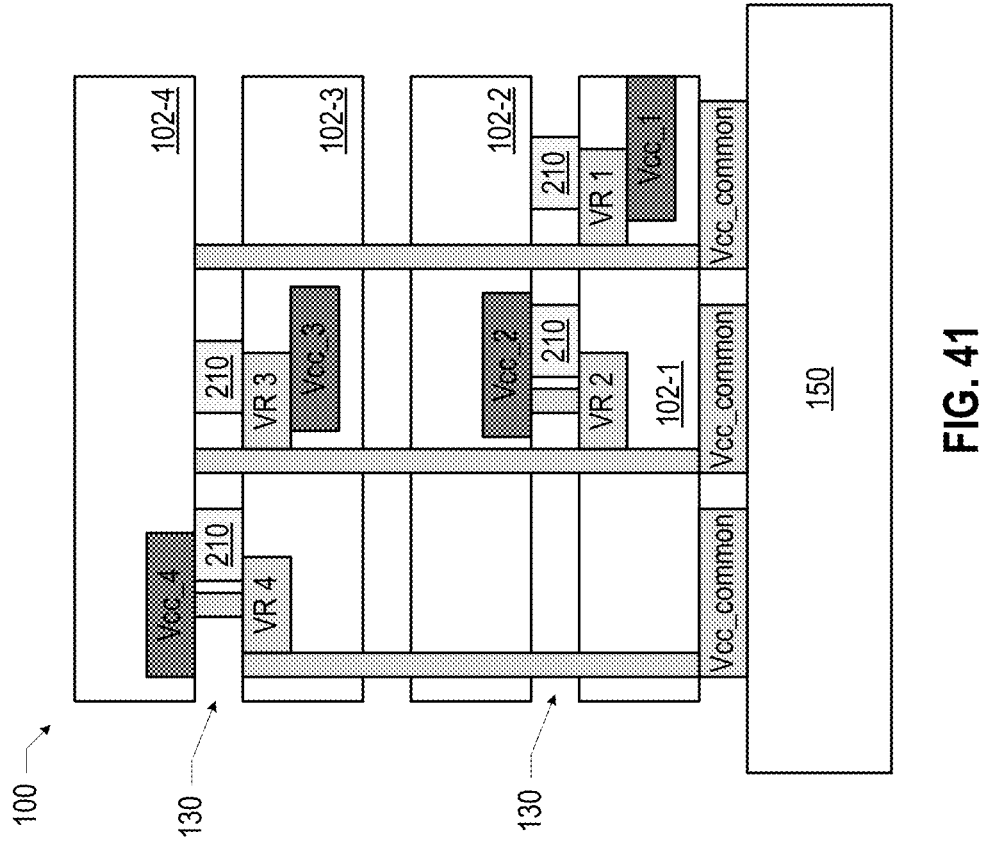
FIG. 41 illustrates a microelectronic assembly including an example power delivery network with an inductor in a direct bonding region, in accordance with various embodiments.

For example, FIG. 41 illustrates a microelectronic assembly 100 including four microelectronic components 102 (labeled 102-1, 102-2, 102-3, and 102-4) arranged in a stack on an interposer 150. The microelectronic component 102-1 and the microelectronic component 102-2 may be coupled together by a DB region 130, and the microelectronic component 102-3 and the microelectronic component 102-4 may be coupled together by a DB region 130; the interposer 150 and the microelectronic component 102-1 may be coupled together by direct bonding or any other suitable attach technology, and the microelectronic component 102-2 and the microelectronic component 102-3 may be coupled together by direct bonding or any other suitable attach technology.

The interposer 150 may provide one or more power rails to the stack of microelectronic components 102; these power rails may be at a single voltage (labeled "Vcc_common" in FIG. 41). The Vcc_common voltage may be provided through the stack of microelectronic components 102 by conductive pathways (e.g., including TSVs). Additional power rails, as well as ground paths, may be present in the interposer 150, but are not depicted for clarity of illustration. One or more of the microelectronic components 102 may include voltage regulator circuitry to change the Vcc_common voltage into a desired operating voltage for a particular power domain. In some embodiments, a microelectronic component 102 may include voltage regulator circuitry for a power domain used by the microelectronic component 102. For example, in the embodiment of FIG. 41, the microelectronic component 102-1 may include voltage regulator circuitry VR 1 that takes in the Vcc_common voltage and converts it to a voltage Vcc_1 for use in the microelectronic component 102-1. The DB region 130 coupling the microelectronic component 102-1 to the microelectronic component 102-2 may include at least one inductor 210 that is part of the voltage regulator circuitry VR 1. Similarly, the microelectronic component 102-3 may include voltage regulator circuitry VR 3 that takes in the Vcc_common voltage and converts it to a voltage Vcc_3 for use in a microelectronic component 102-3. The DB region 130 coupling the microelectronic component 102-3 to the microelectronic component 102-4 may include at least one inductor 210 that is part of the voltage regulator circuitry VR 3.

In some embodiments, a microelectronic component 102 may include voltage regulator circuitry for a power domain used by a different microelectronic component 102. For example, in the embodiment of FIG. 41, the microelectronic component 102-1 may include voltage regulator circuitry VR 2 that takes in the Vcc_common voltage and converts it to a voltage Vcc_2 for use in the microelectronic component 102-2. The DB region 130 coupling the microelectronic component 102-1 to the microelectronic component 102-2 may include at least one inductor 210 that is part of the voltage regulator circuitry VR 2. Similarly, the microelectronic component 102-3 may include voltage regular circuitry VR 4 that takes in the Vcc_common voltage and converts it to a voltage Vcc_4 for use in the microelectronic component 102-4. The DB region 130 coupling the microelectronic component 102-3 to the microelectronic component 102-4 may include at least one inductor 210 that is part of voltage regular circuitry VR 4. In some embodiments, a stack of microelectronic components 102 may include multiple microelectronic components 102 that have the same voltage requirements; in such embodiments, the "lowest" such microelectronic component 102 in the stack may include appropriate voltage regulator circuitry (which may include one or more inductors 210) and the regulated voltage may be provided to the other ones of the microelectronic components 102 without requiring that they include their own voltage regulator circuitry.

Any of the voltage regulator circuitry (e.g., the voltage regulator circuitry VR 1, 2, 3, or 4 of FIG. 41) may include a Buck regulator. Buck regulators may have better efficiency than some conventional approaches (e.g., low dropout regulators), and can support much higher ratios of input voltage to output voltage. Further, utilizing Buck regulators may reduce the need for high current power rails through a die stack, improving area efficiency and decreasing IR losses. This may be particularly true when the microelectronic component 102 utilizes specialized power device technologies (e.g., includes dies built on a III-V semiconductor foundation, such as gallium nitride-based transistors or gallium arsenide-based transistors). Conventional approaches to fabricating Buck regulators required high inductor values with relatively high quality factors and low DC resistances, and such inductors have been large and expensive to implement using high-volume manufacturing techniques. Using inductors 210 in DB regions 130 as part of Buck regulator circuitry may reduce the cost, area, and complexity of Buck regulators, and thus may advance their adoption in microelectronic assemblies. The particular power delivery network depicted in FIG. 41 is simply illustrative, and the inductors 210 disclosed herein may be included in voltage regulators in any other suitable power delivery network, or in other settings.

Figures 42A, 42B, 43, 44:
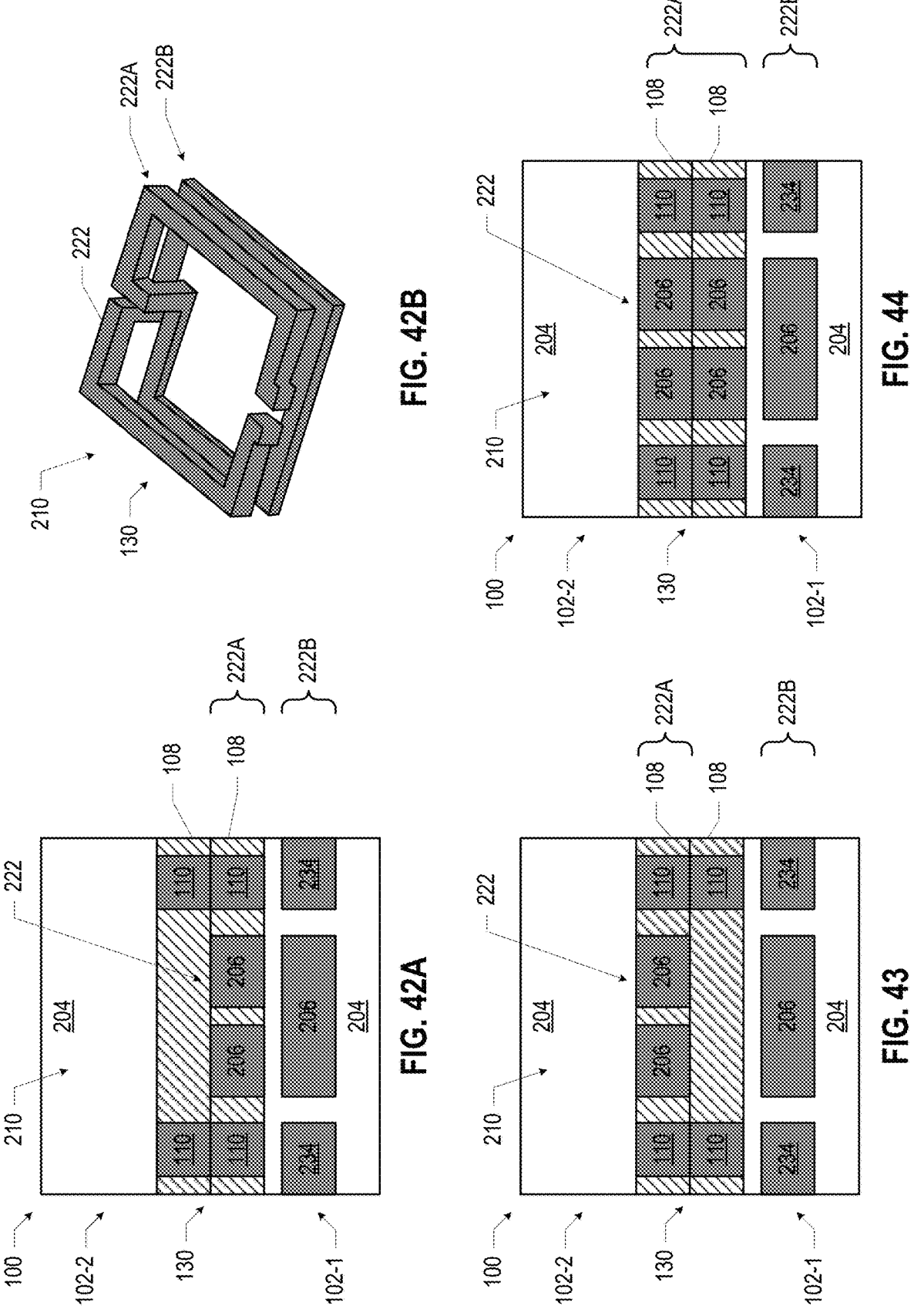
FIGS. 42A-42B illustrate a microelectronic assembly including a direct bonding region with a portion of an inductor, in accordance with various embodiments.
FIGS. 43-44 are side, cross-sectional views of microelectronic assemblies including a direct bonding region with an inductor, in accordance with various embodiments.

In some embodiments, an inductor 210 included in a microelectronic assembly 100 may have at least one turn in a DB region 130, and at least one turn outside the DB region 130 (e.g., in a metallization stack). For example, FIGS. 42A-42B illustrate a microelectronic assembly 100 including a DB region 130 with a portion of an inductor 210, in accordance with various embodiments. FIG. 42A is a side, cross-sectional view of the microelectronic assembly 100, and FIG. 42B is a perspective view of the inductor 210 itself. The inductor 210 of FIG. 42 may include an inductor trace 222 including a first turn 222A and a second turn 222B; the inductor 210 may be electrically coupled to other circuitry in the microelectronic assembly 100 by one or more conductive pathways, not shown. As shown in FIG. 42A, the first turn 222A may be part of the lower microelectronic component 102-1 and in the DB region 130 (e.g., at the DB interface 180 of the lower microelectronic component 102-1 so that the inductor trace material 206 of the first turn 222A may be coplanar with the DB contacts 110 of the lower microelectronic component 102-1). The second turn 222B may be part of the remaining structure 204 of the lower microelectronic component 102-1; for example, the inductor trace material 206 of the second turn 222B may be at least partially coplanar with metallization 234 "below" the DB region 130 in the lower microelectronic component 102-1. Although the particular inductor 210 depicted in FIG. 42 has two turns, this is simply for ease of illustration, and any inductor 210 included at least partially in a DB region 130 may have two or more turns in various embodiments. In the embodiment of FIG. 42, the inductor trace material 206 of the lower microelectronic component 102-1 may be in contact with the DB dielectric 108 of the upper microelectronic component 102-2 in the DB region 130; in some embodiments, the portion of the DB region 130 provided by the upper microelectronic component 102-2 proximate to the first turn 222A of the inductor 210 may be designated as a "keep-out zone" in which no conductive material (e.g., material of the DB contacts 110) may be located.

In some embodiments, an inductor 210 included in a microelectronic assembly 100 may have at least one turn in one microelectronic component 102 of a DB region 130, and at least one turn outside the DB region 130 in the other microelectronic component 102. For example, FIG. 43 illustrates a microelectronic assembly 100 including an inductor 210 that may have the multi-turn structure illustrated in FIG. 42B. As shown in FIG. 43, the first turn 222A may be part of the upper microelectronic component 102-2 and in the DB region 130 (e.g., at the DB interface 180 of the upper microelectronic component 102-2 so that the inductor trace material 206 of the first turn 222A may be coplanar with the DB contacts 110 of the upper microelectronic component 102-2). The second turn 222B of the inductor 210 of FIG. 43 may be part of the remaining structure 204 of the lower microelectronic component 102-1, as discussed above with reference to FIG. 42. In the embodiment of FIG. 43, the inductor trace material 206 of the upper microelectronic component 102-2 may be in contact with the DB dielectric 108 of the lower microelectronic component 102-1 in the DB region 130; in some embodiments, the portion of the DB region 130 provided by the lower microelectronic component 102-1 proximate to the first turn 222A of the inductor 210 may be designated as a "keep-out zone" in which no conductive material (e.g., material of the DB contacts 110) may be located.

In some embodiments, an inductor 210 included in a microelectronic assembly may have at least one turn in a DB region 130, and both microelectronic components 102 may contribute inductor trace material 206 to that turn. For example, FIG. 44 illustrates a microelectronic assembly 100 including an inductor 210 that may have the multi-turn structure illustrated in FIG. 42B. As shown in FIG. 44, the first turn 222A includes inductor trace material 206 provided by both the lower microelectronic component 102-1 and the upper microelectronic component 102-2; these sets of inductor trace material 206, at the DB interfaces 180, may be bonded together, and may take the form of any of the DB contacts 110 disclosed herein. The second turn 222B of the inductor 210 of FIG. 44 may be part of the remaining structure 204 of the lower microelectronic component 102-1, as discussed above with reference to FIG. 42. In embodiments in which the lower microelectronic component 102-1 includes a semiconductor substrate (e.g., a silicon substrate), the inductors 210 of FIGS. 42-44 may be located farther from the substrate then conventional embedded inductors included in lower layers of a metallization stack of the lower microelectronic component 102-1, and thus may exhibit lower substrate losses and higher quality factors (and/or the inductors 210 of FIGS. 42-44 may be made much smaller than conventional embedded inductors for the same quality factor). Further, because the metal thickness (e.g., the thickness of the DB contacts 110) at a DB interface 180 is typically greater than the thickness of the underlying metallization, and inductor 210 that includes at least a portion at a DB interface 180 may be thicker than a conventional embedded inductor, and may therefore have a higher quality factor due to reduced metal losses.

Figures 45A, 45B, 46A, 46B, 46C, 47:
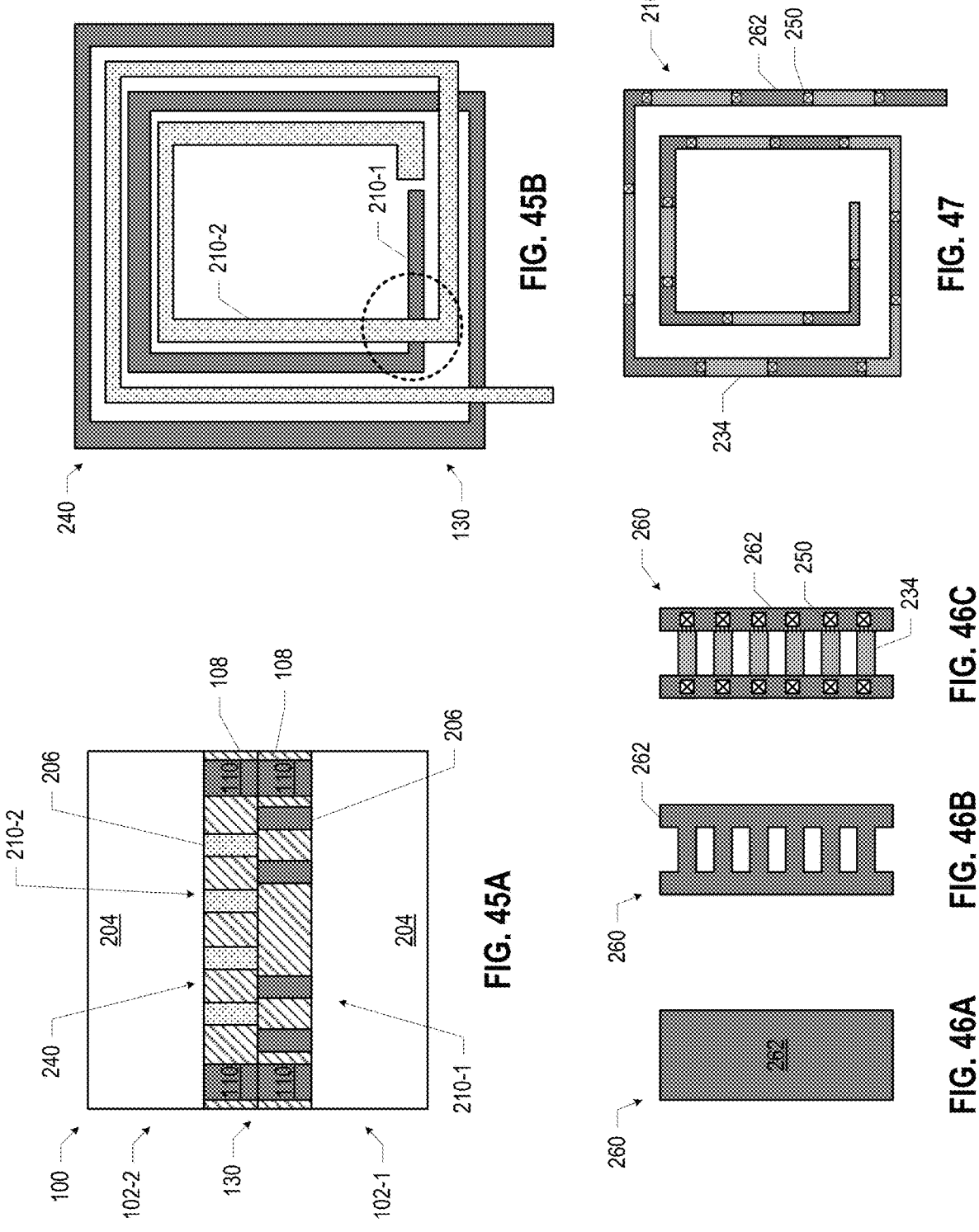
FIGS. 45A-45B illustrate a microelectronic assembly including a direct bonding region with a transformer, in accordance with various embodiments.
FIGS. 46A-46C illustrate conductive structures that may be part of a microelectronic assembly including direct bonding, in accordance with various embodiments.
FIG. 47 is a top view of an inductor that may be at least partially included in a direct bonding region, in accordance with various embodiments.

In some embodiments, a DB region 130 may include at least a portion of a transformer. For example, an inductor 210 in one microelectronic component 102 may be inductively coupled across a DB region 130 to an inductor 210 in another microelectronic component 102, providing a transformer. Such a transformer may be coupled to circuitry in one or both microelectronic components 102. For example, FIG. 45 illustrates a microelectronic assembly 100 in which a DB region 130 includes at least a portion of a first inductor 210-1 (in the lower microelectronic component 102-1) and at least a portion of a second inductor 210-2 (in the upper microelectronic component 102-2); together, the first inductor 210-1 and the second inductor 210-2 may provide a transformer 240. FIG. 45A is a side, cross-sectional view of the microelectronic assembly 100, and FIG. 45B is a top view of the inductors 210 themselves, depicting their coil structures. As shown in FIG. 45A, the first inductor 210-1 may not physically contact the second inductor 210-2, but during operation, the first inductor 210-1 may be inductively coupled with the second inductor 210-2. Note that, in areas in which the footprint of the first inductor 210-1 overlaps with the footprint of the second inductor 210-2 (e.g., in the area indicated by the dotted circle in FIG. 45B), one or both of the inductors 210 may include a vertical "jog," with a segment of the inductor 210 dropping down to a lower metal layer through one or more vias in order to avoid contact with the other inductor 210.

in various ones of the embodiments disclosed herein, it may be desirable to have conductive structures (e.g., DB contacts 110, inductor trace material 206) at a DB interface 180. However, when these conductive structures have too large of a continuous area, the planarization operations applied to the DB interface 180 before direct bonding may cause the top surface of the conductive structure to have a concave shape (a phenomenon referred to as "dishing"). Such dishing may negatively impact the reliability of subsequent direct bonding operations. Furthermore, during dielectric-to-dielectric bonding, conductive traces that are long, continuous, and/or wide may also negatively impact the bonding and may result in bonding voids. To mitigate the risks of dishing and bonding voids while substantially maintaining a desired overall area (e.g., to achieve a desired inductance), a conductive structure at a DB interface 180 may be modified so that the portion of the conductive structure at the DB interface 180 has a smaller continuous area, and a portion of the conductive structure away from the DB interface 180 has a larger area.

For example, FIG. 46A is a top view of a conductive structure 260 that includes a large conductive region 262 that may be disposed at a DB interface 180 (e.g., as a DB contact 110 or inductor trace material 206). FIG. 46B illustrates a conductive structure 260 that may be implemented at a DB interface 180 instead of the conductive structure 260 of FIG. 46A. In particular, the conductive structure 260 of FIG. 46B has a "ladder" or "waffle" shape that includes discontinuities in the conductive region 262 at the DB interface 180 (and thereby reduces the risk of dishing) but still largely maintains the overall area of the conductive structure 260 of FIG. 46A. FIG. 46C illustrates another conductive structure 260 may be implemented at a DB interface 180 instead of the conductive structure 260 of FIG. 46A (or instead of the conductive structure 260 of FIG. 46B). In particular, the conductive structure 260 of FIG. 46C also has a "ladder" or "waffle" shape that includes a portion (e.g., the "rails" of the ladder) provided by a conductive region 262 at a DB interface 180, and also includes a portion (e.g., the "rungs" of the ladder) provided by metallization 234 farther away from the DB interface 180 and coupled to the conductive region 262 by vias 250. Such an implementation, relative to the implementation of FIG. 45B, may further reduce the risk of dishing the conductive region 262, while largely maintaining the overall area of the conductive structure 260 of FIG. 46A.

Any of the structures disclosed herein (e.g., any of the inductor traces 222) may utilize the techniques illustrated in FIG. 46. For example, FIG. 47 illustrates an embodiment of a coil inductor 210 (which may be, for example, any of the inductors 210 of the transformer 240 of FIG. 45) that includes conductive regions 262 at a DB interface 180 alternating with metallization 234 farther away from the DB interface 180 (and coupled to the conductive regions 262 by vias 250, as shown). The use of such structures may improve the quality of direct bonding by both reducing dishing and by introducing discontinuities into the direct bonding surface to improve bond wave propagation during bonding.

Figure 48:
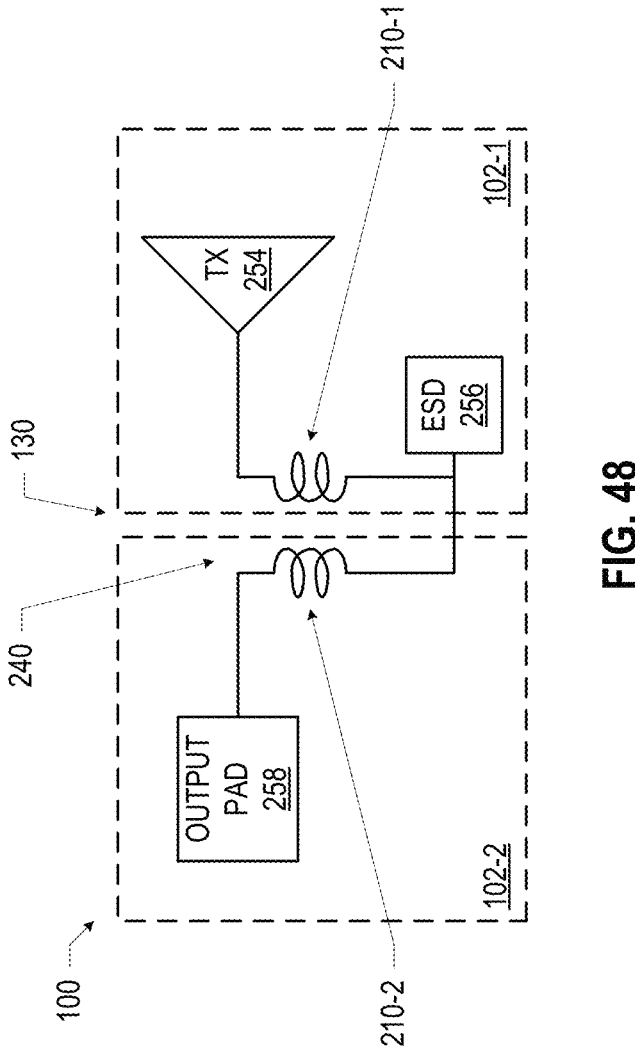
FIG. 48 is a schematic of a circuit that may be included in a microelectronic assembly having a transformer in a direct bonding region, in accordance with various embodiments.

The transformers 240 disclosed herein may be included in any suitable circuit. For example, FIG. 48 is a schematic of a "T-coil" circuit that may be included in a microelectronic assembly 100 having a transformer 240 in a DB region 130, in accordance with various embodiments. In the embodiment of FIG. 48, a lower microelectronic component 102-1 may include a transceiver 254 (e.g., a high-speed transceiver), electrostatic discharge (ESD) protection circuitry 256, and a first inductor 210-1 coupled between the transceiver 254 and the ESD protection circuitry 256. In some embodiments, the ESD protection circuitry 256 may include one or more ESD protection diodes, as known in the art. An upper microelectronic component 102-2 may include an output pad 258 and a second inductor 210-2 coupled between the output pad 258 and the ESD protection circuitry 256 (via an electrical pathway through a DB region 130). The inductors 210-1 and 210-2 together may provide a transformer 240. A T-coil circuit like that of FIG. 48 may reduce the impact of the ESD protection circuitry 256 on the performance of the transceiver 254, allowing faster and more accurate communication (e.g., at radio frequencies). The inductors 210 and/or transformers 240 disclosed herein may be used in any suitable circuitry, such as oscillator circuitry (e.g., phase-locked loop oscillators), amplifier circuitry (e.g., serializers/deserializers that may advantageously include III-V transistors for high efficiency amplification), or equalizer circuitry, and may enable higher quality factors at smaller sizes than conventional approaches. Use of the transformers 240 disclosed herein may allow desired transformer performance to be achieved with a smaller die size and/or fewer metal layers than achievable by the use of conventional transformers.

The microelectronic components 102 and microelectronic assemblies 100 disclosed herein may be included in any suitable electronic component. FIGS. 49-52 illustrate various examples of apparatuses that may include, or be included in, as suitable, any of the microelectronic components 102 and microelectronic assemblies 100 disclosed herein.

Figure 49:
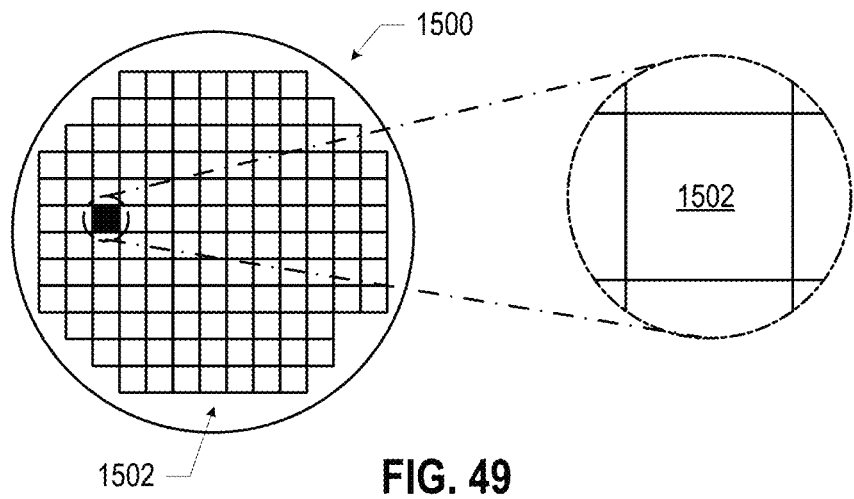
FIG. 49 is a top view of a wafer and dies that may be included in a microelectronic component in accordance with any of the embodiments disclosed herein.

FIG. 49 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 50, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 52) or other logic that is configured to store information in the memory devices or execute instructions stored in the memory array.

Figure 50:
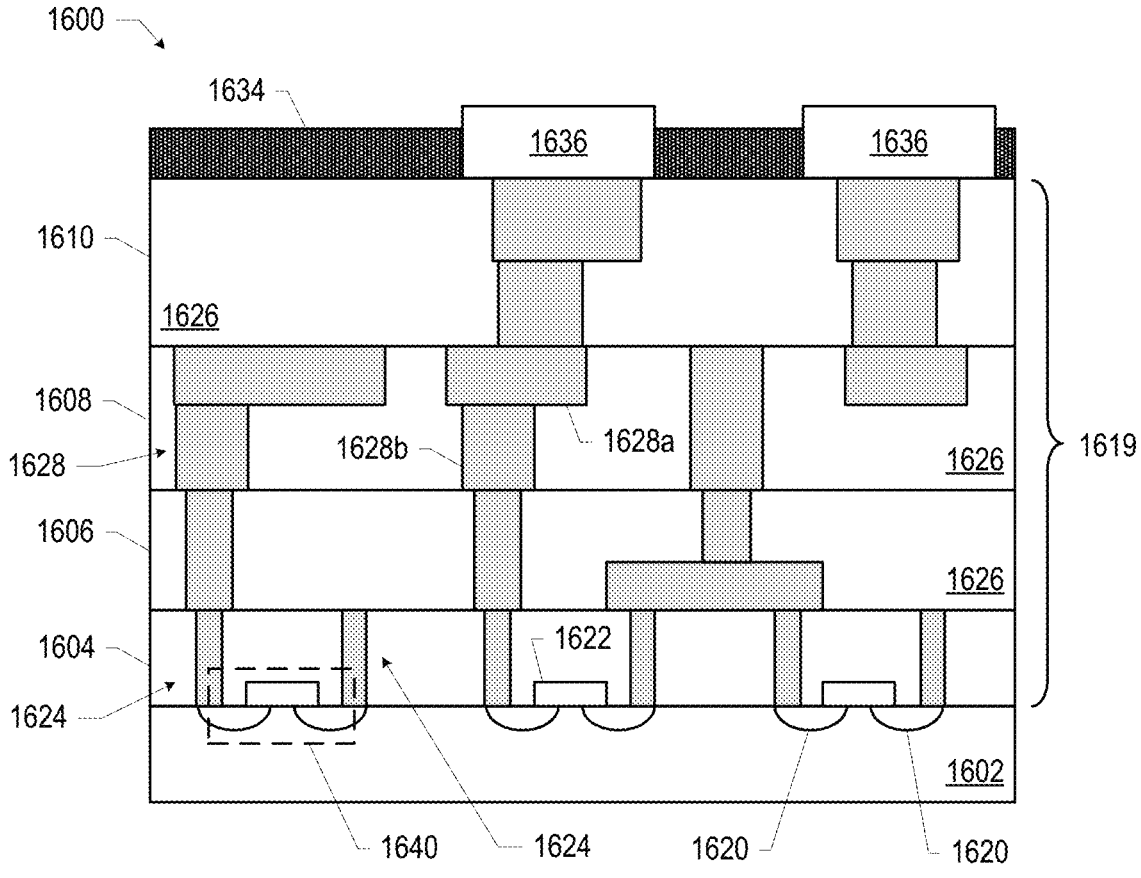
FIG. 50 is a side, cross-sectional view of an integrated circuit (IC) device that may be included in a microelectronic component in accordance with any of the embodiments disclosed herein.

FIG. 50 is a side, cross-sectional view of an IC device 1600 that may be included in any of the microelectronic components 102 disclosed herein. For example, an IC device 1600 (e.g., as part of a die 1502, as discussed above with reference to FIG. 49) may serve as a microelectronic component 102, or may be included in a microelectronic component 102. One or more of the IC devices 1600 may be included in one or more dies 1502 (FIG. 49). The IC device 1600 may be formed on a substrate 1602 (e.g., the wafer 1500 of FIG. 49) and may be included in a die (e.g., the die 1502 of FIG. 49). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 49) or a wafer (e.g., the wafer 1500 of FIG. 49).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 50 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Nonplanar transistors may include FinFET transistors, such as double-gate transistors or tri-gate transistors, and wraparound or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 50 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 50). Although a particular number of interconnect layers 1606-1610 is depicted in FIG. 50, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 50. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 50. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual Damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 50, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 51:
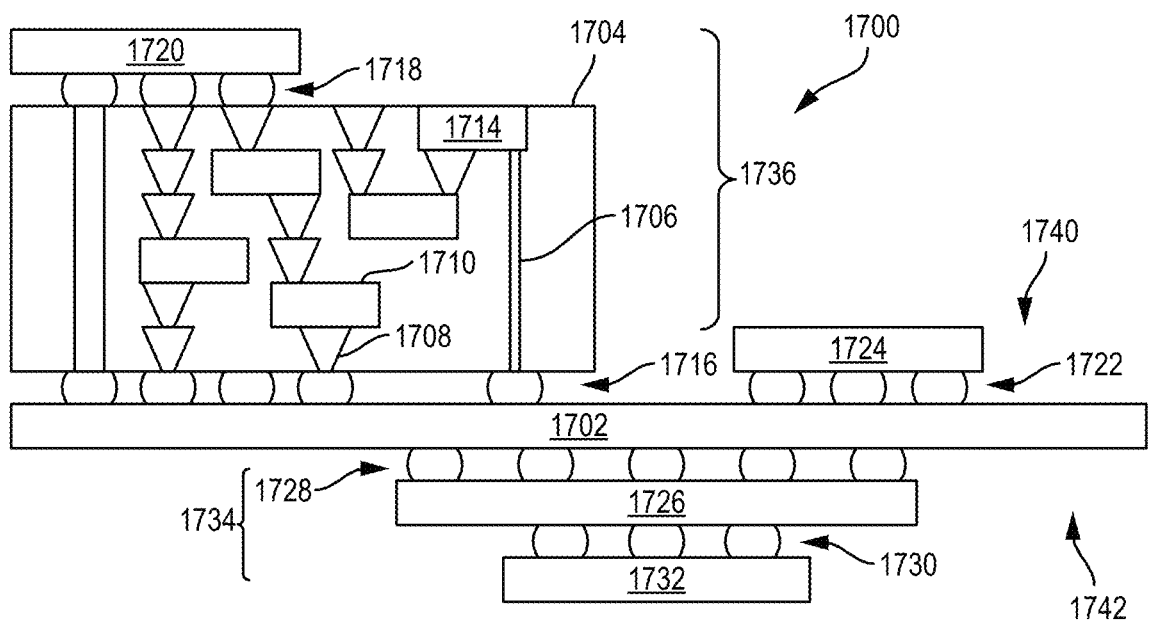
FIG. 51 is a side, cross-sectional view of an IC device assembly that may include a microelectronic assembly in accordance with any of the embodiments disclosed herein.

FIG. 51 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 51 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 51), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 51, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 49), an IC device (e.g., the IC device 1600 of FIG. 50), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 51, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, ESD devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 51 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 52:
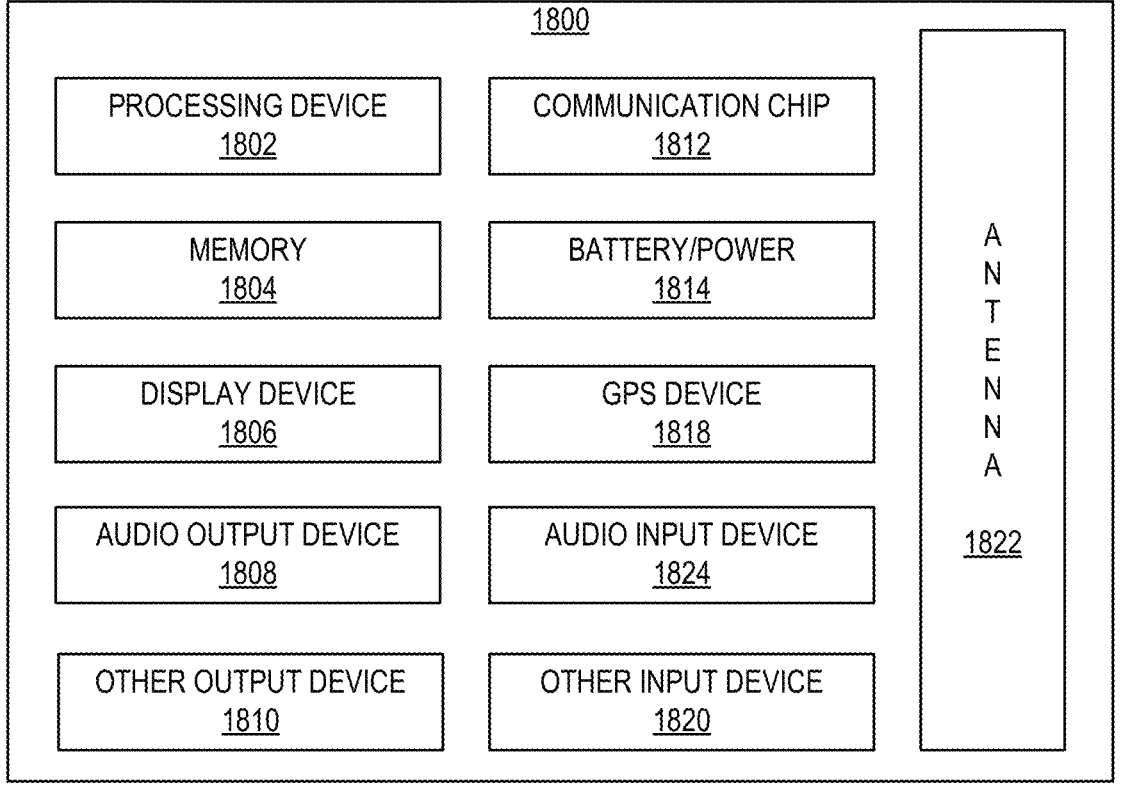
FIG. 52 is a block diagram of an example electrical device that may include a microelectronic assembly in accordance with any of the embodiments disclosed herein.

FIG. 52 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 52 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 52, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is a microelectronic assembly, including: a first microelectronic component; and a second microelectronic component coupled to the first microelectronic component by a direct bonding region, wherein the direct bonding region includes at least part of an inductor.

Example A2 includes the subject matter of Example A1, and further specifies that the direct bonding region includes at least part of a magnetic region of the inductor.

Example A3 includes the subject matter of Example A2, and further specifies that the magnetic region includes nickel and iron.

Example A4 includes the subject matter of any of Examples A2-3, and further specifies that the magnetic region includes cobalt, zirconium, and tantalum.

Example A5 includes the subject matter of any of Examples A2-4, and further specifies that the magnetic region includes a layer of magnetic material having a thickness that is less than 200 nanometers.

Example A6 includes the subject matter of Example A5, and further specifies that the thickness of the layer of magnetic material is between 10 nanometers and 200 nanometers.

Example A7 includes the subject matter of Example A6, and further specifies that the thickness of the layer of magnetic material is between 10 nanometers and 100 nanometers.

Example A8 includes the subject matter of Example A7, and further specifies that the thickness of the layer of magnetic material is between 20 nanometers and 40 nanometers.

Example A9 includes the subject matter of any of Examples A2-8, and further specifies that the magnetic region includes a first layer of magnetic material, a second layer of magnetic material, and a layer of dielectric material between the first layer of magnetic material and the second layer of magnetic material.

Example A10 includes the subject matter of Example A9, and further specifies that the layer of dielectric material has a thickness that is less than 1 micron.

Example A11 includes the subject matter of Example A10, and further specifies that the thickness of the layer of dielectric material is greater than 0.01 micron.

Example A12 includes the subject matter of any of Examples A2-11, and further specifies that the magnetic region has a thickness that is less than 1 micron.

Example A13 includes the subject matter of Example A12, and further specifies that the thickness of the magnetic region is greater than 0.01 microns.

Example A14 includes the subject matter of any of Examples A2-13, and further specifies that the magnetic region includes a first portion provided by the first microelectronic component and a second portion provided by the second microelectronic component.

Example A15 includes the subject matter of Example A14, and further specifies that the first portion is in contact with the second portion.

Example A16 includes the subject matter of Example A14, and further specifies that the first portion is not in contact with the second portion.

Example A17 includes the subject matter of any of Examples A14-16, and further specifies that the first portion has a lip extending away from a side of the first portion.

Example A18 includes the subject matter of Example A17, and further specifies that the second portion has a lip extending away from a side of the second portion.

Example A19 includes the subject matter of any of Examples A14-18, and further specifies that the first portion is larger than the second portion.

Example A20 includes the subject matter of any of Examples A14-19, and further specifies that the first portion has a first U-shaped cross-section, the second portion has a second U-shaped cross-section, and the first U-shaped cross-section is larger than the second U-shaped cross-section.

Example A21 includes the subject matter of any of Examples A2-20, and further specifies that the direct bonding region includes at least part of a conductive trace of the inductor, and the magnetic region extends at least partially around the conductive trace.

Example A22 includes the subject matter of Example A21, and further specifies that the conductive trace has a thickness between 0.1 microns and 12 microns.

Example A23 includes the subject matter of any of Examples A21-22, and further specifies that the conductive trace includes copper.

Example A24 includes the subject matter of Example A23, and further specifies that the conductive trace also includes manganese and nickel.

Example A25 includes the subject matter of any of Examples A21-24, and further specifies that the conductive trace includes manganese, titanium, gold, silver, palladium, nickel, aluminum, tantalum, or cobalt.

Example A26 includes the subject matter of Example A25, and further specifies that the conductive trace includes tantalum and nitrogen.

Example A27 includes the subject matter of any of Examples A25-26, and further specifies that the conductive trace includes cobalt and iron.

Example A28 includes the subject matter of any of Examples A21-27, and further specifies that the conductive trace includes a metal contact of the first microelectronic component bonded with a metal contact of the second microelectronic component.

Example A29 includes the subject matter of Example A28, and further specifies that the metal contact of the first microelectronic component includes a bulk metal region and an interface metal region, and a material composition of the interface metal region is different from a material composition of the bulk metal region.

Example A30 includes the subject matter of Example A29, and further specifies that the metal contact of the first microelectronic component has a non-circular footprint.

Example A31 includes the subject matter of any of Examples A21-30, and further specifies that the conductive trace includes a first portion provided by the first microelectronic component and a second portion provided by the second microelectronic component.

Example A32 includes the subject matter of Example A31, and further specifies that the first portion is in contact with the second portion.

Example A33 includes the subject matter of any of Examples A21-32, and further specifies that the conductive trace is a first conductive trace, the first conductive trace is provided by the first microelectronic component, the direct bonding region includes at least part of a second conductive trace of the inductor, the second conductive trace is provided by the second microelectronic component, and the magnetic region extends at least partially around the second conductive trace.

Example A34 includes the subject matter of Example A33, and further specifies that the first conductive trace and the second conductive trace are spaced apart in the direct bonding region.

Example A35 includes the subject matter of any of Examples A21-34, and further specifies that the conductive trace is a first conductive trace, the conductive trace is a first conductive trace, the first conductive trace is provided by the first microelectronic component, the direct bonding region includes at least part of a second conductive trace of the inductor, the second conductive trace is provided by the first microelectronic component, and the magnetic region extends at least partially around the second conductive trace.

Example A36 includes the subject matter of Example A35, and further specifies that the first conductive trace and the second conductive trace are spaced apart in the direct bonding region.

Example A37 includes the subject matter of any of Examples A21-36, and further specifies that the conductive trace has a curved portion.

Example A38 includes the subject matter of any of Examples A21-37, and further specifies that the conductive trace has a straight portion.

Example A39 includes the subject matter of any of Examples A2-38, and further specifies that the direct bonding region includes at least part of a dielectric region of the inductor, wherein the dielectric region is between the conductive trace and the magnetic region.

Example A40 includes the subject matter of Example A39, and further specifies that the dielectric region includes aluminum and nitrogen.

Example A41 includes the subject matter of any of Examples A39-40, and further specifies that the dielectric region has a thickness between 0.1 microns and 2 microns.

Example A42 includes the subject matter of any of Examples A39-41, and further specifies that the dielectric region includes a first portion provided by the first microelectronic component and a second portion provided by the second microelectronic component.

Example A43 includes the subject matter of Example A42, and further specifies that the first portion is in contact with the second portion.

Example A44 includes the subject matter of Example A42, and further specifies that the first portion is not in contact with the second portion.

Example A45 includes the subject matter of any of Examples A42-44, and further specifies that the first portion is larger than the second portion.

Example A46 includes the subject matter of any of Examples A42-45, and further specifies that the first portion has a first U-shaped cross-section, the second portion is a second U-shaped cross-section, and the first U-shaped cross-section is larger than the second U-shaped cross-section.

Example A47 includes the subject matter of any of Examples A1-46, and further specifies that the direct bonding region includes at least part of a conductive trace of the inductor.

Example A48 includes the subject matter of Example A47, and further specifies that the conductive trace has a thickness between 0.1 microns and 12 microns.

Example A49 includes the subject matter of any of Examples A47-48, and further specifies that the conductive trace includes copper.

Example A50 includes the subject matter of Example A49, and further specifies that the conductive trace also includes manganese and nickel.

Example A51 includes the subject matter of any of Examples A47-50, and further specifies that the conductive trace includes manganese, titanium, gold, silver, palladium, nickel, aluminum, tantalum, or cobalt.

Example A52 includes the subject matter of Example A51, and further specifies that the conductive trace includes tantalum and nitrogen.

Example A53 includes the subject matter of any of Examples A51-52, and further specifies that the conductive trace includes cobalt and iron.

Example A54 includes the subject matter of any of Examples A47-53, and further specifies that the conductive trace includes a metal contact of the first microelectronic component bonded with a metal contact of the second microelectronic component.

Example A55 includes the subject matter of Example A54, and further specifies that the metal contact of the first microelectronic component includes a bulk metal region and an interface metal region, and a material composition of the interface metal region is different from a material composition of the bulk metal region.

Example A56 includes the subject matter of Example A55, and further specifies that the metal contact of the first microelectronic component has a non-circular footprint.

Example A57 includes the subject matter of any of Examples A47-56, and further specifies that the conductive trace includes a first portion provided by the first microelectronic component and a second portion provided by the second microelectronic component.

Example A58 includes the subject matter of Example A57, and further specifies that the first portion is in contact with the second portion.

Example A59 includes the subject matter of any of Examples A47-58, and further specifies that the conductive trace is a first conductive trace, the first conductive trace is provided by the first microelectronic component, the direct bonding region includes at least part of a second conductive trace of the inductor, and the second conductive trace is provided by the second microelectronic component.

Example A60 includes the subject matter of Example A59, and further specifies that the first conductive trace and the second conductive trace are spaced apart in the direct bonding region.

Example A61 includes the subject matter of any of Examples A47-60, and further specifies that the conductive trace is a first conductive trace, the conductive trace is a first conductive trace, the first conductive trace is provided by the first microelectronic component, the direct bonding region includes at least part of a second conductive trace of the inductor, and the second conductive trace is provided by the first microelectronic component.

Example A62 includes the subject matter of Example A61, and further specifies that the first conductive trace and the second conductive trace are spaced apart in the direct bonding region.

Example A63 includes the subject matter of any of Examples A47-62, and further specifies that the conductive trace has a curved portion.

Example A64 includes the subject matter of any of Examples A47-63, and further specifies that the conductive trace has a straight portion.

Example A65 includes the subject matter of any of Examples A47-64, and further specifies that the direct bonding region includes at least part of a dielectric region of the inductor, wherein the dielectric region extends at least partially around the conductive trace.

Example A66 includes the subject matter of Example A65, and further specifies that the dielectric region includes aluminum and nitrogen.

Example A67 includes the subject matter of any of Examples A65-66, and further specifies that the dielectric region has a thickness between 0.1 microns and 2 microns.

Example A68 includes the subject matter of any of Examples A65-67, and further specifies that the dielectric region includes a first portion provided by the first microelectronic component and a second portion provided by the second microelectronic component.

Example A69 includes the subject matter of Example A68, and further specifies that the first portion is in contact with the second portion.

Example A70 includes the subject matter of Example A68, and further specifies that the first portion is not in contact with the second portion.

Example A71 includes the subject matter of any of Examples A68-70, and further specifies that the first portion is larger than the second portion.

Example A72 includes the subject matter of any of Examples A68-71, and further specifies that the first portion has a first U-shaped cross-section, the second portion is a second U-shaped cross-section, and the first U-shaped cross-section is larger than the second U-shaped cross-section.

Example A73 includes the subject matter of any of Examples A1-72, and further specifies that the direct bonding region includes at least part of a dielectric region of the inductor, wherein the dielectric region is between a conductive trace of the inductor and a magnetic region of the inductor.

Example A74 includes the subject matter of Example A73, and further specifies that the dielectric region includes aluminum and nitrogen.

Example A75 includes the subject matter of any of Examples A73-74, and further specifies that the dielectric region has a thickness between 0.1 microns and 2 microns.

Example A76 includes the subject matter of any of Examples A73-75, and further specifies that the dielectric region includes a first portion provided by the first microelectronic component and a second portion provided by the second microelectronic component.

Example A77 includes the subject matter of Example A76, and further specifies that the first portion is in contact with the second portion.

Example A78 includes the subject matter of Example A76, and further specifies that the first portion is not in contact with the second portion.

Example A79 includes the subject matter of any of Examples A76-78, and further specifies that the first portion is larger than the second portion.

Example A80 includes the subject matter of any of Examples A76-79, and further specifies that the first portion has a first U-shaped cross-section, the second portion is a second U-shaped cross-section, and the first U-shaped cross-section is larger than the second U-shaped cross-section.

Example A81 includes the subject matter of any of Examples A1-80, and further specifies that the first microelectronic component includes an interposer.

Example A82 includes the subject matter of any of Examples A1-81, and further specifies that the first microelectronic component includes a die.

Example A83 includes the subject matter of any of Examples A1-82, and further specifies that the second microelectronic component includes a die.

Example A84 includes the subject matter of any of Examples A1-83, and further specifies that the microelectronic assembly further includes a heat spreader, and the second microelectronic component is between the first microelectronic component and the heat spreader.

Example A85 includes the subject matter of Example A84, and further specifies that the microelectronic assembly further includes a thermal interface material between the second microelectronic component and the heat spreader.

Example A86 is a microelectronic assembly, including: a first microelectronic component; and a second microelectronic component coupled to the first microelectronic component by a direct bonding region, wherein the direct bonding region includes at least part of a helical coil of an inductor.

Example A87 includes the subject matter of Example A86, and further specifies that the direct bonding region includes at least part of a magnetic region of the inductor.

Example A88 includes the subject matter of Example A87, and further specifies that the magnetic region includes nickel and iron.

Example A89 includes the subject matter of any of Examples A87-88, and further specifies that the magnetic region includes cobalt, zirconium, and tantalum.

Example A90 includes the subject matter of any of Examples A87-89, and further specifies that the magnetic region has a thickness that is less than 1 micron.

Example A91 includes the subject matter of Example A90, and further specifies that the thickness of the magnetic region is greater than 0.01 microns.

Example A92 includes the subject matter of any of Examples A87-91, and further specifies that the magnetic region includes a magnetic plane.

Example A93 includes the subject matter of any of Examples A86-92, and further specifies that the helical coil includes copper.

Example A94 includes the subject matter of Example A93, and further specifies that the helical coil also includes manganese and nickel.

Example A95 includes the subject matter of any of Examples A86-94, and further specifies that the helical coil includes manganese, titanium, gold, silver, palladium, nickel, aluminum, tantalum, or cobalt.

Example A96 includes the subject matter of Example A95, and further specifies that the helical coil includes tantalum and nitrogen.

Example A97 includes the subject matter of any of Examples A95-96, and further specifies that the helical coil includes cobalt and iron.

Example A98 includes the subject matter of any of Examples A86-97, and further specifies that the helical coil includes a metal contact of the first microelectronic component bonded with a metal contact of the second microelectronic component.

Example A99 includes the subject matter of Example A98, and further specifies that the metal contact of the first microelectronic component includes a bulk metal region and an interface metal region, and a material composition of the interface metal region is different from a material composition of the bulk metal region.

Example A100 includes the subject matter of Example A99, and further specifies that the metal contact of the first microelectronic component has a non-circular footprint.

Example A101 includes the subject matter of any of Examples A86-100, and further specifies that the helical coil includes a first portion provided by the first microelectronic component and a second portion provided by the second microelectronic component.

Example A102 includes the subject matter of Example A101, and further specifies that the first portion is in contact with the second portion.

Example A103 includes the subject matter of any of Examples A86-102, and further specifies that the first microelectronic component includes an interposer.

Example A104 includes the subject matter of any of Examples A86-103, and further specifies that the first microelectronic component includes a die.

Example A105 includes the subject matter of any of Examples A86-104, and further specifies that the second microelectronic component includes a die.

Example A106 includes the subject matter of any of Examples A86-105, and further specifies that the microelectronic assembly further includes a heat spreader, and the second microelectronic component is between the first microelectronic component and the heat spreader.

Example A107 includes the subject matter of Example A106, and further specifies that the microelectronic assembly further includes a thermal interface material between the second microelectronic component and the heat spreader.

Example A108 is a system, including: a circuit board; and any of the microelectronic assemblies of any of Examples A1-107, communicatively coupled to the circuit board.

Example A109 includes the subject matter of Example A108, and further specifies that the circuit board is a motherboard.

Example A110 includes the subject matter of any of Examples A108-109, and further specifies that the system is a handheld computing system.

Example A111 includes the subject matter of any of Examples A108-110, and further specifies that the system is a wearable computing system.

Example A112 includes the subject matter of any of Examples A108-109, and further specifies that the system is a server computing system.

Example A113 includes the subject matter of any of Examples A108-109, and further specifies that the system is a vehicular computing system.

Example A114 includes the subject matter of any of Examples A108-113, and further specifies that the system further includes a display communicatively coupled to the circuit board.

Example A115 includes the subject matter of any of Examples A108-114, and further specifies that the system further includes a wireless communication device communicatively coupled to the circuit board.

Example A116 includes the subject matter of any of Examples A108-115, and further specifies that the system further includes a housing around the microelectronic assembly and the circuit board.

Example A117 includes the subject matter of any of Examples A108-116, and further specifies that the inductor is part of a voltage regulator circuit.

Example A118 includes the subject matter of Example A117, and further specifies that the voltage regulator circuit is a Buck regulator circuit.

Example A119 includes the subject matter of any of Examples A117-118, and further specifies that the first microelectronic component or the second microelectronic component includes a III-V transistor.

Example A120 includes the subject matter of any of Examples A118, and further specifies that the III-V transistor includes gallium.

Example B1 is a microelectronic assembly, including: a first microelectronic component having a direct bonding interface, wherein the first microelectronic component includes an inductor trace, and an interface portion of the inductor trace is at the direct bonding interface of the first microelectronic component; and a second microelectronic component having a direct bonding interface, wherein the direct bonding interface of the second microelectronic component is coupled to the direct bonding interface of the first microelectronic component.

Example B2 includes the subject matter of Example B1, and further specifies that the interface portion of the inductor trace is part of a first turn of the inductor trace, and at least a portion of a second turn of the inductor trace is in a metallization stack of the first microelectronic component.

Example B3 includes the subject matter of any of Examples B1-2, and further specifies that the interface portion of the inductor trace is in contact with dielectric material of the direct bonding interface of the second microelectronic component.

Example B4 includes the subject matter of any of Examples B1-2, and further specifies that the interface portion of the inductor trace is in contact with conductive material of the direct bonding interface of the second microelectronic component.

Example B5 includes the subject matter of any of Examples B1-4, and further specifies that the inductor trace is a first inductor trace, the second microelectronic component includes a second inductor trace, and the first inductor trace and second inductor trace are parts of a transformer.

Example B6 includes the subject matter of Example B5, and further specifies that an interface portion of the second inductor trace is at the direct bonding interface of the second microelectronic component.

Example B7 includes the subject matter of Example B6, and further specifies that the interface portion of the second inductor trace does not contact the interface portion of the first inductor trace.

Example B8 includes the subject matter of any of Examples B6-7, and further specifies that the interface portion of the second inductor trace includes segments of the second inductor trace that alternate with segments of the second inductor trace in a metallization stack of the second microelectronic component.

Example B9 includes the subject matter of any of Examples B6-8, and further specifies that the interface portion of the second inductor trace includes portions of the second inductor trace that are electrically coupled by a portion of the second inductor trace in a metallization stack of the second microelectronic component.

Example B10 includes the subject matter of any of Examples B5-9, and further specifies that the second inductor trace has a coil structure.

Example B11 includes the subject matter of any of Examples B5-10, and further specifies that the transformer is part of a T-coil circuit.

Example B12 includes the subject matter of any of Examples B5-11, and further specifies that the transformer is electrically coupled to a diode.

Example B13 includes the subject matter of any of Examples B1-12, and further specifies that the interface portion of the inductor trace includes segments of the inductor trace that alternate with segments of the inductor trace in a metallization stack of the first microelectronic component.

Example B14 includes the subject matter of any of Examples B1-13, and further specifies that the inductor trace has a coil structure.

Example B15 includes the subject matter of any of Examples B1-14, and further specifies that the interface portion of the inductor trace includes portions of the inductor trace that are electrically coupled by a portion of the inductor trace in a metallization stack of the first microelectronic component.

Example B16 includes the subject matter of any of Examples B1-15, and further specifies that the inductor trace includes copper.

Example B17 includes the subject matter of Example B16, and further specifies that the inductor trace also includes manganese and nickel.

Example B18 includes the subject matter of any of Examples B1-17, and further specifies that the inductor trace includes manganese, titanium, gold, silver, palladium, nickel, aluminum, tantalum, or cobalt.

Example B19 includes the subject matter of Example B18, and further specifies that the inductor trace includes tantalum and nitrogen.

Example B20 includes the subject matter of any of Examples B18-19, and further specifies that the inductor trace includes cobalt and iron.

Example B21 includes the subject matter of any of Examples B1-20, and further specifies that the inductor trace includes a bulk metal region and an interface metal region, and a material composition of the interface metal region is different from a material composition of the bulk metal region.

Example B22 includes the subject matter of any of Examples B1-21, and further specifies that the interface portion of the inductor trace has a non-circular footprint.

Example B23 includes the subject matter of any of Examples B1-22, and further specifies that the first microelectronic component includes an interposer.

Example B24 includes the subject matter of any of Examples B1-23, and further specifies that the first microelectronic component includes a die.

Example B25 includes the subject matter of any of Examples B1-24, and further specifies that the second microelectronic component includes a die.

Example B26 includes the subject matter of any of Examples B1-25, and further specifies that the microelectronic assembly further includes a heat spreader, and the second microelectronic component is between the first microelectronic component and the heat spreader.

Example B27 includes the subject matter of Example B26, and further specifies that the microelectronic assembly further includes a thermal interface material between the second microelectronic component and the heat spreader.

Example B28 is a microelectronic assembly, including: a first microelectronic component; and a second microelectronic component, wherein the first microelectronic component and the second microelectronic component are coupled by a direct bonding region, and the direct bonding region includes at least part of a transformer.

Example B29 includes the subject matter of Example B28, and further specifies that the direct bonding region includes metal-to-metal bonds and dielectric-to-dielectric bonds.

Example B30 includes the subject matter of any of Examples B28-29, and further specifies that the transformer includes a first inductor and a second inductor, the first inductor is included in the first microelectronic component, and the second inductor is included in the second microelectronic component.

Example B31 includes the subject matter of Example B30, and further specifies that an interface portion of the first inductor is at a direct bonding interface of the first microelectronic component.

Example B32 includes the subject matter of Example B31, and further specifies that an interface portion of the second inductor is at a direct bonding interface of the second microelectronic component.

Example B33 includes the subject matter of Example B32, and further specifies that the interface portion of the second inductor does not contact the interface portion of the first inductor.

Example B34 includes the subject matter of any of Examples B32-33, and further specifies that the interface portion of the second inductor includes segments of the second inductor that alternate with segments of the second inductor in a metallization stack of the second microelectronic component.

Example B35 includes the subject matter of any of Examples B32-34, and further specifies that the interface portion of the second inductor includes portions of the second inductor that are electrically coupled by a portion of the second inductor in a metallization stack of the second microelectronic component.

Example B36 includes the subject matter of any of Examples B30-35, and further specifies that the second inductor has a coil structure.

Example B37 includes the subject matter of any of Examples B30-36, and further specifies that the interface portion of the first inductor includes segments of the first inductor that alternate with segments of the first inductor in a metallization stack of the first microelectronic component.

Example B38 includes the subject matter of any of Examples B30-37, and further specifies that the interface portion of the first inductor includes portions of the first inductor that are electrically coupled by a portion of the first inductor in a metallization stack of the first microelectronic component.

Example B39 includes the subject matter of any of Examples B30-38, and further specifies that the first inductor has a coil structure.

Example B40 includes the subject matter of any of Examples B28-39, and further specifies that the transformer is part of a T-coil circuit.

Example B41 includes the subject matter of any of Examples B28-40, and further specifies that the transformer is electrically coupled to a diode.

Example B42 includes the subject matter of Example B28, and further specifies that the first microelectronic component has a direct bonding interface, and at least a portion of the transformer is at the direct bonding interface.

Example B43 includes the subject matter of Example B42, and further specifies that the portion of the transformer includes copper.

Example B44 includes the subject matter of Example B43, and further specifies that the portion of the transformer also includes manganese and nickel.

Example B45 includes the subject matter of any of Examples B42-44, and further specifies that the portion of the transformer includes manganese, titanium, gold, silver, palladium, nickel, aluminum, tantalum, or cobalt.

Example B46 includes the subject matter of Example B45, and further specifies that the portion of the transformer includes tantalum and nitrogen.

Example B47 includes the subject matter of any of Examples B45-46, and further specifies that the portion of the transformer includes cobalt and iron.

Example B48 includes the subject matter of any of Examples B42-47, and further specifies that the portion of the transformer includes a bulk metal region and an interface metal region, and a material composition of the interface metal region is different from a material composition of the bulk metal region.

Example B49 includes the subject matter of any of Examples B28-48, and further specifies that the first microelectronic component includes an interposer.

Example B50 includes the subject matter of any of Examples B28-49, and further specifies that the first microelectronic component includes a die.

Example B51 includes the subject matter of any of Examples B28-50, and further specifies that the second microelectronic component includes a die.

Example B52 includes the subject matter of any of Examples B28-51, and further specifies that the transformer is a radio frequency transformer.

Example B53 includes the subject matter of any of Examples B28-52, and further specifies that the transformer is electrically coupled to a transceiver.

Example B54 includes the subject matter of Example B53, and further specifies that the transceiver is a high-speed transceiver.

Example B55 includes the subject matter of any of Examples B28-34, and further specifies that the microelectronic assembly further includes a heat spreader, and the second microelectronic component is between the first microelectronic component and the heat spreader.

Example B56 includes the subject matter of Example B55, and further specifies that the microelectronic assembly further includes a thermal interface material between the second microelectronic component and the heat spreader.

Example B57 includes the subject matter of any of Examples B28-56, and further specifies that the first microelectronic component or the second microelectronic component includes a III-V transistor.

Example B58 includes the subject matter of Example B57, and further specifies that the III-V transistor includes gallium.

Example B59 is a system, including: a circuit board; and any of the microelectronic assemblies of any of Examples B1-58, communicatively coupled to the circuit board.

Example B60 includes the subject matter of Example B59, and further specifies that the circuit board is a motherboard.

Example B61 includes the subject matter of any of Examples B59-60, and further specifies that the system is a handheld computing system.

Example B62 includes the subject matter of any of Examples B59-61, and further specifies that the system is a wearable computing system.

Example B63 includes the subject matter of any of Examples B59-60, and further specifies that the system is a server computing system.

Example B64 includes the subject matter of any of Examples B59-60, and further specifies that the system is a vehicular computing system.

Example B65 includes the subject matter of any of Examples B59-64, and further specifies that the system further includes a display communicatively coupled to the circuit board.

Example B66 includes the subject matter of any of Examples B59-65, and further specifies that the system further includes a wireless communication device communicatively coupled to the circuit board.

Example B67 includes the subject matter of any of Examples B59-56, and further specifies that the system further includes a housing around the microelectronic assembly and the circuit board.

The invention claimed is:

1. A microelectronic assembly, comprising:
a first microelectronic component; and
a second microelectronic component coupled to the first microelectronic component by a direct bonding region, wherein the direct bonding region comprises at least part of a conductive trace of an inductor, the conductive trace comprises a metal contact of the first microelectronic component bonded with a metal contact of the second microelectronic component, the metal contact of the first microelectronic component comprises a bulk metal region and an interface metal region, and a material composition of the interface metal region is different from a material composition of the bulk metal region.

2. The microelectronic assembly of claim 1, wherein the conductive trace comprises a first portion provided by the first microelectronic component and a second portion provided by the second microelectronic component, the first portion in contact with the second portion.

3. The microelectronic assembly of claim 1, wherein the conductive trace is a first conductive trace, the first conductive trace is provided by the first microelectronic component, the direct bonding region further comprises at least part of a second conductive trace of the inductor, and the second conductive trace is provided by the second microelectronic component.

4. The microelectronic assembly of claim 3, wherein the first conductive trace and the second conductive trace are spaced apart in the direct bonding region.

5. The microelectronic assembly of claim 1, wherein the conductive trace has a curved portion.

6. A microelectronic assembly, comprising:
a first microelectronic component; and
a second microelectronic component coupled to the first microelectronic component by a direct bonding region, wherein the direct bonding region comprises at least part of a dielectric region of an inductor, and the dielectric region is between a conductive trace of the inductor and a magnetic region of the inductor.

7. The microelectronic assembly of claim 6, wherein the dielectric region comprises aluminum and nitrogen.

8. The microelectronic assembly of claim 6, wherein the dielectric region has a thickness between 0.1 microns and 2 microns.

9. The microelectronic assembly of claim 6, wherein the dielectric region comprises a first portion provided by the first microelectronic component and a second portion provided by the second microelectronic component.

10. The microelectronic assembly of claim 9, wherein the first portion is in contact with the second portion.

11. The microelectronic assembly of claim 9, wherein the first portion has a first U-shaped cross-section, the second portion has a second U-shaped cross-section, and the first U-shaped cross-section is larger than the second U-shaped cross-section.

12. A system comprising:
a first die; and
a second die coupled to the first die in a direct bonding region, wherein the direct bonding region comprises at least part of a conductive trace of an inductor, the direct bonding region further comprises at least part of a dielectric region of the inductor, and the dielectric region extends at least partially around the conductive trace.

13. The system of claim 12, further comprising a circuit board communicatively coupled to the first die.

14. The system of claim 12, wherein the conductive trace comprises a metal contact of the first die bonded with a metal contact of the second die.

15. The system of claim 12, wherein the dielectric region comprises a first portion provided by the first die and a second portion provided by the second die.

16. The system of claim 12, wherein the inductor further comprises a magnetic region and a dielectric region, and the dielectric region is between the conductive trace and the magnetic region.

17. A microelectronic assembly, comprising:
a first microelectronic component; and
a second microelectronic component coupled to the first microelectronic component by a direct bonding region, wherein the direct bonding region comprises at least part of a dielectric region of an inductor, and the dielectric region comprises aluminum and nitrogen.

18. The microelectronic assembly of claim 17, wherein the direct bonding region further comprises at least part of a conductive trace of an inductor, and the dielectric region extends at least partially around the conductive trace.

19. A microelectronic assembly, comprising:
a first microelectronic component; and
a second microelectronic component coupled to the first microelectronic component by a direct bonding region, wherein the direct bonding region comprises at least part of a dielectric region of an inductor, and the dielectric region has a thickness between 0.1 microns and 2 microns.

20. The microelectronic assembly of claim 19, wherein the dielectric region comprises aluminum and nitrogen.

* * * * *